United States Patent
Matsushita et al.

(10) Patent No.: US 11,399,451 B2
(45) Date of Patent: Jul. 26, 2022

(54) COMPONENT REFILL MANAGEMENT SYSTEM AND COMPONENT MOUNTING SYSTEM

(71) Applicant: YAMAHA HATSUDOKI KABUSHIKI KAISHA, Iwata (JP)

(72) Inventors: Yoichi Matsushita, Shizuoka (JP); Masaki Higashino, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 246 days.

(21) Appl. No.: 16/475,526

(22) PCT Filed: Jan. 15, 2018

(86) PCT No.: PCT/JP2018/000871
§ 371 (c)(1),
(2) Date: Jul. 2, 2019

(87) PCT Pub. No.: WO2018/135446
PCT Pub. Date: Jul. 26, 2018

(65) Prior Publication Data
US 2019/0373782 A1    Dec. 5, 2019

(30) Foreign Application Priority Data

Jan. 17, 2017  (WO) ................ PCT/JP2017/001377

(51) Int. Cl.
*H05K 13/08*     (2006.01)
*H05K 13/04*     (2006.01)
*G05B 19/042*    (2006.01)

(52) U.S. Cl.
CPC ......... *H05K 13/086* (2018.08); *G05B 19/042* (2013.01); *H05K 13/0419* (2018.08); *H05K 13/0882* (2018.08); *G05B 2219/34436* (2013.01)

(58) Field of Classification Search
CPC ............ H05K 13/086; H05K 13/0419; H05K 13/0882; G05B 19/042; G05B 2219/34436
See application file for complete search history.

(56) References Cited

U.S. PATENT DOCUMENTS 6,829,514 B2 * 12/2004 Gyorfi ................. H05K 13/085
                                                                 700/99
7,899,561 B2 *  3/2011 Maenishi ........... H05K 13/0853
                                                                 700/28
(Continued)

FOREIGN PATENT DOCUMENTS

CN        104429175 A     3/2015
JP        2011-060816 A   3/2011
(Continued)

OTHER PUBLICATIONS

International Search Report issued in PCT/JP2018/000871; dated Mar. 13, 2018.
(Continued)

*Primary Examiner* — Jeffrey T Carley
(74) *Attorney, Agent, or Firm* — Studebaker & Brackett PC

(57) ABSTRACT

In a component refill management system, a refill specifying unit specifies a component supply device which is to be refilled with a new reel. The refill specifying unit includes a first specifying unit, a second specifying unit, and a third specifying unit. The first specifying unit specifies refillable time intervals of new reels with the time intervals being associated with each of the component supply devices. The second specifying unit recognizes, in each of the refillable time intervals, a first refillable time interval having an earliest second time at which a sum of residual components reaches a predetermined value, and specifies a component supply device, which is associated with the first refillable (Continued)

time interval, as a first component supply device. The third specifying unit specifies a component supply device, which can be refilled with a reel within the first refillable time interval, as a second component supply device.

20 Claims, 23 Drawing Sheets

(56) References Cited

U.S. PATENT DOCUMENTS

| | | | | |
|---|---|---|---|---|
| 10,123,468 | B2* | 11/2018 | Matsumori | H05K 13/0813 |
| 10,139,810 | B2* | 11/2018 | Nakamura | H05K 13/089 |
| 10,683,184 | B2* | 6/2020 | Oyama | H05K 13/0215 |
| 2004/0153868 | A1* | 8/2004 | Nonaka | G06Q 10/10 |
| | | | | 714/47.2 |
| 2009/0125424 | A1* | 5/2009 | Wegelin | G06Q 10/087 |
| | | | | 705/28 |
| 2015/0115093 | A1* | 4/2015 | Tanokuchi | H05K 13/021 |
| | | | | 242/560.1 |
| 2016/0353621 | A1* | 12/2016 | Maezono | H05K 13/086 |

FOREIGN PATENT DOCUMENTS

| | | |
|---|---|---|
| JP | 2012-028660 A | 2/2012 |
| JP | 2015-041734 A | 3/2015 |
| JP | 2015-130403 A | 7/2015 |
| JP | 2016-225385 A | 12/2016 |
| WO | WO-2006035651 A1 * | 4/2006 ........... H05K 13/087 |

OTHER PUBLICATIONS

International Search Report issued in PCT/JP2017/001377; dated Apr. 25, 2017.

* cited by examiner

FIG. 9

| BOARD NAME | NUMBER OF BOARDS TO BE PRODUCED | PRODUCING ORDER | COMPONENT TO BE USED | | | |
|---|---|---|---|---|---|---|
| | | | ID | COMPONENT NAME | NUMBER OF NECESSARY COMPONENTS (NUMBER PER BOARD) | CYCLE TIME (SEC PER BOARD) |
| BOARD A | A | 1 | IA1 | A1 | AA1 | AAA1 |
| | | | IA2 | A2 | AA2 | AAA1 |
| | | | ... | ... | ... | ... |

JH11 — BOARD NAME
JH12 — NUMBER OF BOARDS TO BE PRODUCED
JH13 — PRODUCING ORDER
JH14 — COMPONENT TO BE USED
JH141 — ID
JH142 — COMPONENT NAME
JH143 — NUMBER OF NECESSARY COMPONENTS
JH144 — CYCLE TIME
JH1

FIG. 10

| JH11 | JH21 | JH22 | JH23 | JH141 | JH24 | JH25 |
|---|---|---|---|---|---|---|
| BOARD NAME | CARRIAGE ID | FEEDER ID | REEL ID | COMPONENT ID | SUM OF RESIDUAL COMPONENTS | RESIDUAL COMPONENT NUMBER WARNING VALUE |
| BOARD A | IDA | IFA1 | IRA11 | IA1 | A11 | AAAA1 |
| | | | IRA12 | | | |
| | | IFA2 | IRA21 | IA2 | A21 | AAAA2 |
| | | | IRA22 | | | |
| | | ... | ... | ... | ... | ... |

BEFORE IMPROVEMENT IN REFILLING EFFICIENCY — JH5

| BOARD NAME | COMPONENT TO BE USED | | COMPONENT SUPPLY DEVICE | | REFILLING CYCLE (MINUTE) | | REFILLING FREQUENCY PER HOUR IN COLLECTIVE REFILL |
|---|---|---|---|---|---|---|---|
| | ID | COMPONENT NAME | FEEDER ID | NUMBER | BEFORE COLLECTIVE REFILL | COLLECTIVE REFILL | |
| BOARD A | IA1 | A1 | IFA1 | 1 | TT1 | TT1 | TT |
| | IA2 | A2 | IFA2 | 1 | TT2 | | |
| | IA3 | A3 | IFA3 | 1 | TT3 | | |

AFTER IMPROVEMENT IN REFILLING EFFICIENCY

| BOARD NAME | COMPONENT TO BE USED | | COMPONENT SUPPLY DEVICE | | REFILLING CYCLE (MINUTE) | | REFILLING FREQUENCY PER HOUR IN COLLECTIVE REFILL |
|---|---|---|---|---|---|---|---|
| | ID | COMPONENT NAME | FEEDER ID | NUMBER | BEFORE COLLECTIVE REFILL | COLLECTIVE REFILL | |
| BOARD A | IA1 | A1 | IFA1-1 | 2 | TT1-1 | TT2 | TT1 |
| | | | IFA1-2 | | TT1-1 | | |
| | IA2 | A2 | IFA2 | 1 | TT2 | | |
| | IA3 | A3 | IFA3 | 1 | TT3 | | |

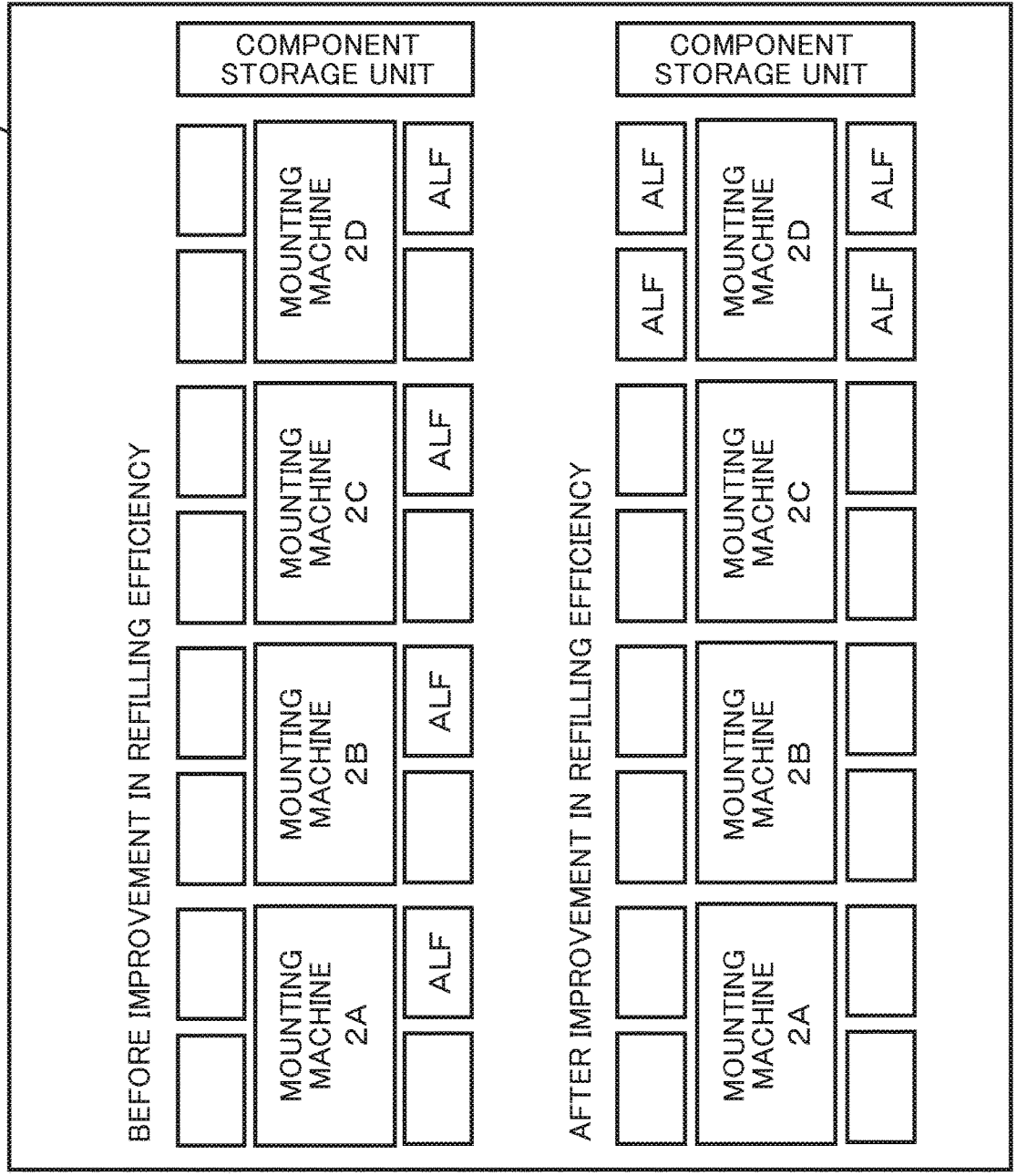

FIG. 22

TIME SCHEDULE

REFILL TIME: TH ......... J3A1

| NAME OF MOUNTING MACHINE | POSITION OF COMPONENT SUPPLY UNIT | COMPONENT SUPPLY DEVICE | | COMPONENT ID | COMPONENT NAME |
|---|---|---|---|---|---|
| | | TYPE | ID | | |
| JA | BA | ALF | IFA1 | IA1 | A1 |
| | BC | TRAY | IFT1 | IT1 | T1 |
| | BD | STICK | IFS1 | IS1 | S1 |
| | BB | SPLICING | IFZ1 | IZ1 | Z1 |
| ... | ... | ... | ... | ... | ... |

| COMPONENT STORAGE RACK NUMBER | COMPONENT ID | COMPONENT NAME | QUANTITY |
|---|---|---|---|
| BA | IA1 | A1 | 1 |
| BC | IT1 | T1 | 1 |
| BD | IS1 | S1 | 1 |
| BB | IZ1 | Z1 | 1 |
| ... | ... | ... | ... |

TIME SCHEDULE
PICKUP TIME: TS — J4A1
REFILL TIME: TH — J4A2

J4A3, J4A4, J4A5, J4A6, JH4A

COMPONENT REFILL MANAGEMENT SYSTEM AND COMPONENT MOUNTING SYSTEM

CROSS-REFERENCE TO RELATED APPLICATION

This application claims benefit of priority to International Patent Application No. PCT/JP2017/001377, filed Jan. 17, 2017, and to International Patent Application No. PCT/JP2018/000871, filed Jan. 15, 2018, the entire content of which is incorporated herein by reference.

BACKGROUND

Technical Field

The present disclosure relates to a component refill management system that is installed in a mounting machine for mounting components to boards and manages refilling of a component housing member housing the components for a component supply device to which the component housing member is attachable, and relates to a component mounting system including the component refill management system.

Background Art

A mounting machine that mounts electronic components (hereinafter, simply referred to as "components") onto a board such as a printed wiring board and produces a mounting board includes a component supply device to which a component housing member housing the components is attachable. Prior to the production of mounting boards using the mounting machine, an operator performs a preparation operation, for example, for attaching the component housing member necessary for the production to the component supply device, based on a production plan for mounting boards. The production then starts. During the production of the mounting boards, the operator performs a refilling operation for refilling the component supply device with the component housing member in accordance with component consumption associated with the production of the mounting board. Such an operation prevents a shutdown of the supply of the components from the component supply device, and thus prevents shutdown of the production of the mounting boards.

JP 2012-28660 A discloses, for example, a technique that improves efficiency of the refilling operation to be performed by an operator. The technique disclosed in JP 2012-28660 A executes a process for predicting a time interval during which absence of components in a plurality of component supply devices (feeders) installed in each mounting machine is predicted in a component mounting line where the plurality of mounting machines are installed, and executes a process for allocating an operator who performs a refilling operation in the component absence predicted time interval.

SUMMARY

In the technique disclosed in JP 2012-28660 A, unfortunately, refill timings of component housing members are individually set for the respective component supply devices. In a case where the refilling operation is performed in accordance with the refill timing set for each of the component supply devices, an operator needs to highly-frequently move to mounting machines including the component supply devices, and thus needs to run about in confusion among the mounting machines. This situation results in huge burdens of the refilling operation on the operator.

The present disclosure has been made in view of such circumstances, and provides a component refill management system that can reduce a burden on an operator who performs a refilling operation on a component housing member for a component supply device, and a component mounting system including the component refill management system.

One aspect of the present disclosure provides a component refill management system that is installed in a mounting machine and manages refilling of a plurality of component housing members housing components for a plurality of component supply devices, the mounting machine mounting a component to board and producing a mounting board, the plurality of component housing members being attachable to each of the component supply devices. The component refill management system includes a refill specifying unit that specifies a component supply device which is to be refilled with a component housing member, and an information output unit that outputs specified result information representing a specified result obtained by the refill specifying unit. The refill specifying unit includes a first specifying unit that specifies refillable time intervals representing time intervals during which a new component housing member is refillable between a first time at which, in the plurality of component housing members, one component housing member, from which components are precedently supplied, has no component in each of the component supply devices and a second time at which a sum of residual components housed in the plurality of component housing members reaches a predetermined value with the refillable time intervals being associated with the component supply devices, respectively, a second specifying unit that recognizes a first refillable time interval having an earliest second time in the refillable time intervals and specifies a component supply device, which is associated with the first refillable time interval, as a first component supply device which is to be preferentially refilled with a component housing member, and a third specifying unit that specifies a component supply device, which is refillable with a component housing member within the first refillable time interval, as a second component supply device, with reference to the refillable time intervals.

Another aspect of the present disclosure provides a component mounting system including: a mounting machine that is mounted with a plurality of component supply devices to which a plurality of component housing members housing components are attachable, and mounts a component to a board and produces a mounting board; the component refill management system that manages refilling of the component housing members for the plurality of component supply devices, and a management device that is data-communicably connected to the component refill management system via the information output unit and manages the production of the mounting board.

These objects, features, and advantages of the present disclosure will become more apparent from the following detailed description taken in conjunction with the accompanying drawings.

BRIEF DESCRIPTION OF THE DRAWINGS

FIG. 9 is a diagram describing production plan information to be input into the component refill management system;

FIG. 10 is a diagram describing preparation information to be input into the component refill management system;

FIG. 14 is a diagram describing first refilling efficiency improvement information generated by a refilling efficiency improvement specifying unit in the component refill management system;

FIG. 15 is a diagram describing second refilling efficiency improvement information generated by the refilling efficiency improvement specifying unit in the component refill management system;

FIG. 22 is a diagram describing refill specified result information generated by the refill specifying unit in a component mounting system including the mounting machine of FIG. 21; and FIG. 23 is a diagram describing pickup specified result information generated by the pickup specifying unit in accordance with the refill specified result information of FIG. 22.

DETAILED DESCRIPTION

A component refill management system and a component mounting system according to embodiments of the present disclosure will be described below with reference to the drawings.

[Overall Configuration of Component Mounting System]

Figure 1:
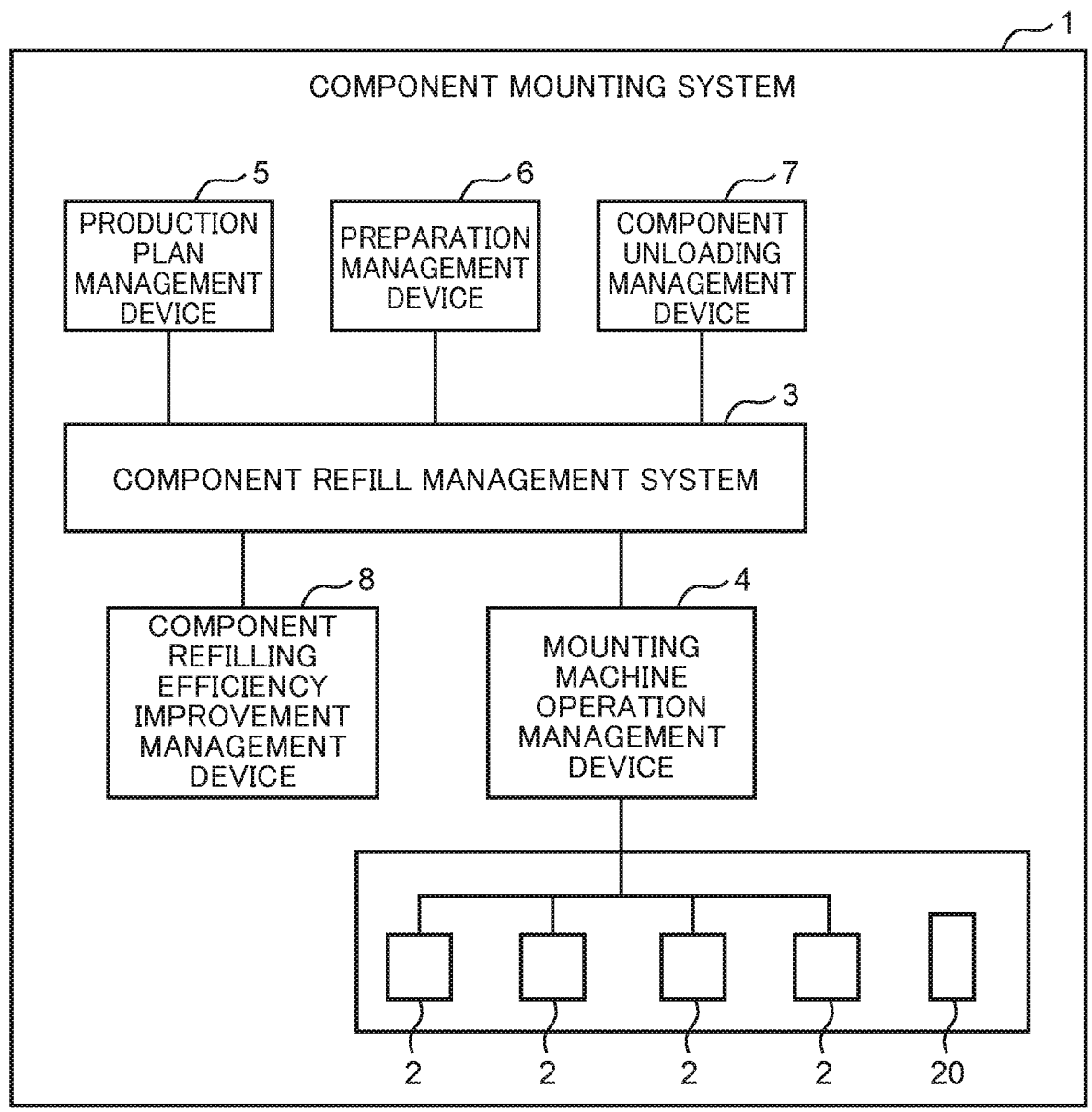
FIG. 1 is a diagram schematically illustrating a configuration of a component mounting system according to one embodiment of the present disclosure.

FIG. 1 is a diagram schematically illustrating a configuration of a component mounting system 1 according to one embodiment of the present disclosure. The component mounting system 1 includes a mounting machine 2, a component refill management system 3, a mounting machine operation management device 4, a production plan management device 5, a preparation management device 6, a component unloading management device 7, and a component refilling efficiency improvement management device 8. In the component mounting system 1, the mounting machine operation management device 4, the production plan management device 5, the preparation management device 6, the component unloading management device 7, and the component refilling efficiency improvement management device 8 are data-communicably connected to the component refill management system 3, and manage production of mounting boards to be performed by the mounting machine 2. In the component mounting system 1, the plurality of mounting machines 2 are arranged. In an example illustrated in FIG. 1, four mounting machines 2 are installed in parallel.

<Configuration of Mounting Machine>

Figure 2:
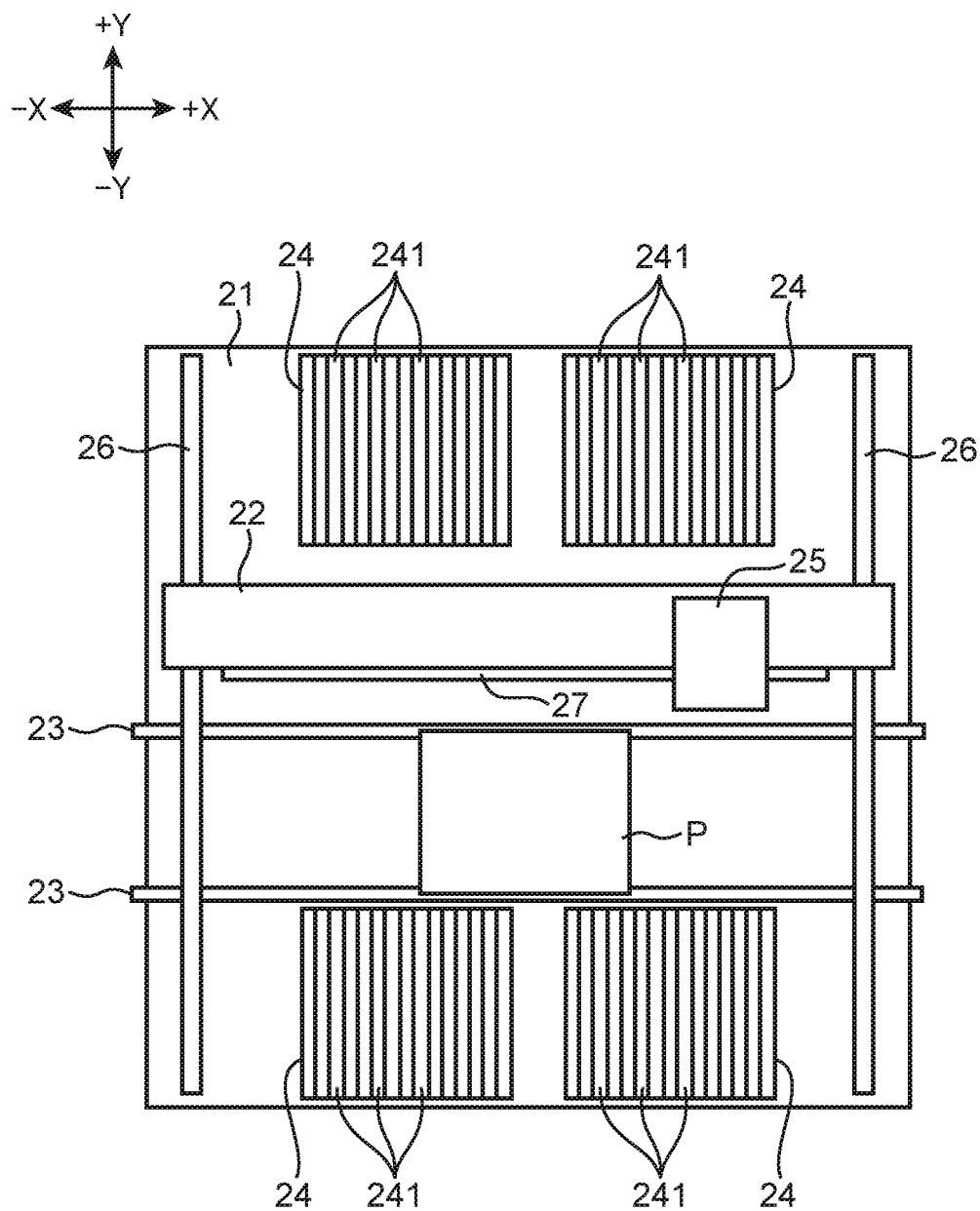
FIG. 2 is a plan view illustrating a configuration of a mounting machine.

A configuration of the mounting machine 2 will be described with reference to FIG. 2. FIG. 2 is a plan view illustrating the configuration of the mounting machine 2. A directional relationship will be described below based on XY rectangular coordinates. One side in the X axis direction is referred to as a "+X side", and the other side opposite to one direction in the X axis direction is referred to as a "−X side". Further, one side in the Y axis direction is referred to as a "+Y side", and the other side opposite to one side in the Y axis direction is referred to as a "−Y side".

The mounting machine 2 is a device that mounts a component on a board P and produces a mounting board. The mounting machine 2 includes a main body frame 21, a moving frame 22, conveyors 23, component supply units 24, a head unit 25, first driving mechanisms 26, and a second driving mechanism 27.

The main body frame 21 is a structure in which respective units constituting the mounting machine 2 are disposed, and has an approximately rectangular shape in a plan view seen from a direction orthogonal to both the X axis direction and the Y axis direction. The conveyors 23 extend along the X axis direction and are disposed in the main body frame 21. The conveyors 23 convey the board P in the X axis direction. The board P is conveyed on the conveyors 23 and is located on a predetermined operation position (a mounting position where a component is mounted on the board P).

The component supply units 24 is disposed on each of the +Y side and the −Y side in the Y axis direction in the main body frame 21, and the component supply unit 24 is disposed on each of two positions in the X axis direction. Thus, totally four component supply units 24 are disposed. Each of the component supply units 24 supplies components to be mounted on the board P, and has a plurality of component supply devices 241. A component housing member housing components is attachable to each of the component supply devices 241. In the present embodiment, each of the component supply devices 241 is a tape feeder that is configured so that a component housing tape, which houses components at predetermined intervals, is wound around a reel as the component housing member, and the component housing tape is fed from the reel.

The tape feeder is generally divided into a splicing feeder and an automatic loading feeder (ALF). In the splicing feeder which is configured so that one reel is attached thereto, before a component housing tape is completely fed from that reel and no component exists, to achieve a shift from that component housing tape to a subsequent component housing tape, a rear end portion of the precedent component housing tape is connected to a front end portion of the subsequent component housing tape by applying a splicing tape and the like to these end portions. That is, in the splicing feeder, a splicing operation using a splicing tape and the like is performed before the component housing tape is completely fed from one reel and has no component. Thus, the refill timing for a reel around which a subsequent component housing tape is wound is limited to the time point when a precedent component housing tape is completely fed.

On the other hand, when completely feeding a component housing tape, from which components are precedently supplied, from one reel around which that component housing tape is wound (hereinafter, a "precedent component housing tape") in the plurality of reels, the ALF, which is configured so that a plurality of reels are attachable thereto, automatically feeds a subsequent component housing tape from another reel around which the subsequent component housing tape is wound without performing the splicing operation. That is, in the ALF, the refill timing for a new reel is not limited to the time point when a precedent component housing tape is completely fed from one reel around which the precedent component housing tape is wound, and thus a degree of freedom is higher in the ALF than in the splicing feeder.

In the present embodiment, as the tape feeders disposed in each of the component supply units 24, the splicing feeder and the ALF may coexist, but the plurality of ALFs, to which a plurality of reels as the component housing members are attachable, are disposed as the component supply devices 241. Details of the component supply devices 241 including the ALFs will be described later.

The moving frame 22 extends along the X axis direction and is supported to the main body frame 21 so as to be movable in a predetermined moving direction (the Y axis direction). The moving frame 22 is loaded with the head unit 25. The head unit 25 is mounted on the moving frame 22 so as to be movable in the X axis direction. That is, the head unit 25 is movable in the Y axis direction in response to a movement of the moving frame 22 and movable in the X axis direction along the moving frame 22. The head unit 25 is movable between the component supply units 24 and a predetermined operating position of the board P conveyed by the conveyors 23, takes a component out of the component supply unit 24, and mounts the taken-out component on the board P.

The first driving mechanisms 26 are disposed on ends on the +X side and the −X side in the main body frame 21, respectively. The first driving mechanisms 26 are mechanisms that move the moving frame 22 in the Y axis direction. Each of the first driving mechanisms 26 includes, for example, a driving motor, a ball screw shaft that extends in the Y axis direction and is connected to the driving motor, and a ball nut that is disposed on the moving frame 22 and is screwed to the ball screw shaft. The first driving mechanisms 26 each having such a configuration move the moving frame 22 in the Y axis direction in a manner that the ball nut moves forward and backward along the ball screw shaft in response to rotation driving of the ball screw shaft caused by the driving motor.

The second driving mechanism 27 is disposed in the moving frame 22. The second driving mechanism 27 is a mechanism that moves the head unit 25 in the X axis direction along the moving frame 22. Similarly in the case of the first driving mechanisms 26, the second driving mechanism 27 includes, for example, a driving motor, a ball screw shaft that extends in the X axis direction and is connected to the driving motor, and a ball nut that is disposed on the head unit 25 and is screwed to the ball screw shaft. The second driving mechanism 27 having such a configuration moves the head unit 25 in the X axis direction in a manner that the ball nut moves forward and backward along the ball screw shaft in response to rotational driving of the ball screw shaft caused by the driving motor.

<Configuration of Component Supply Unit Having Component Supply Device>

Figure 3:
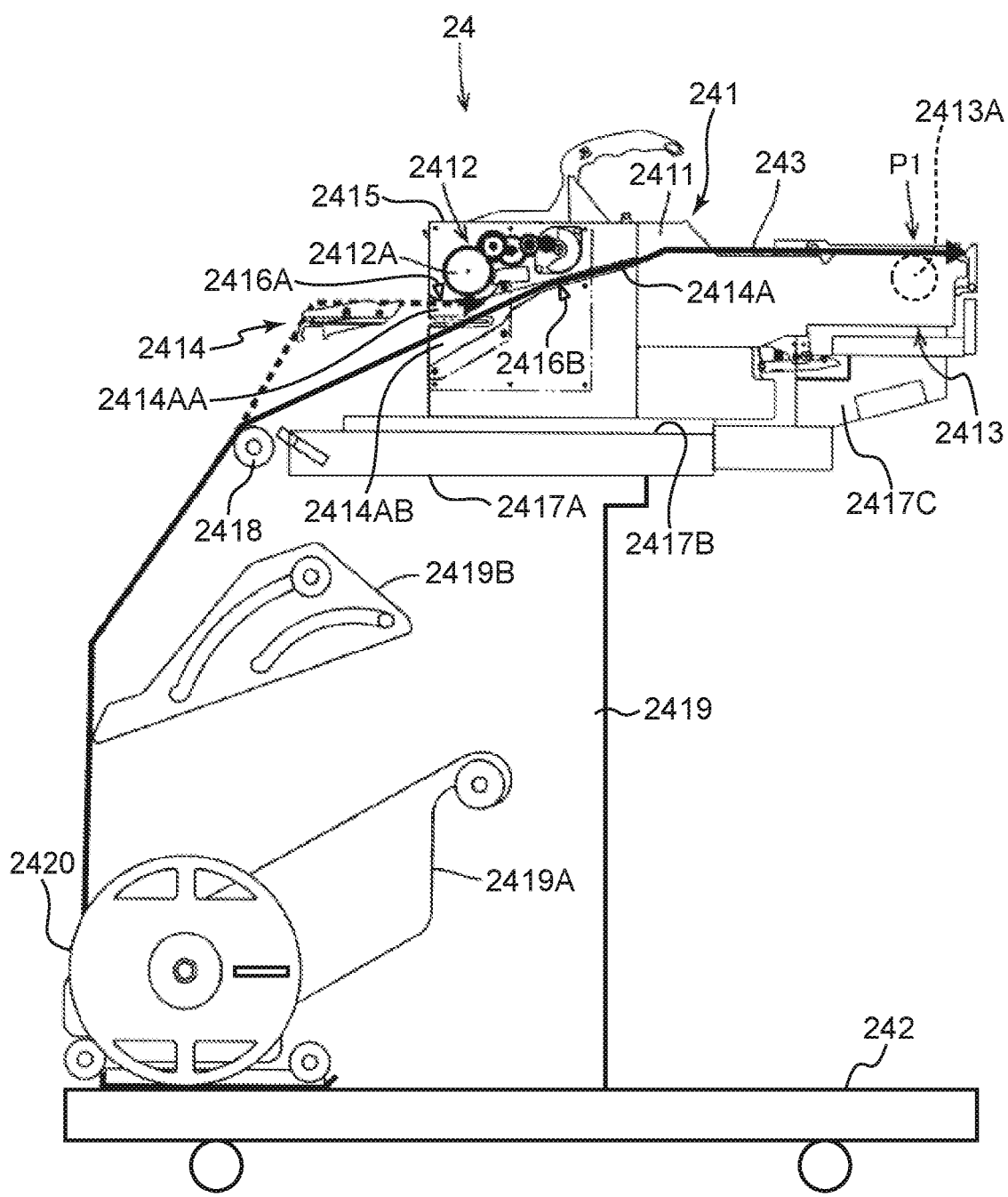
FIG. 3 is a diagram schematically illustrating a configuration of a component supply unit in the mounting machine.
Figure 4:
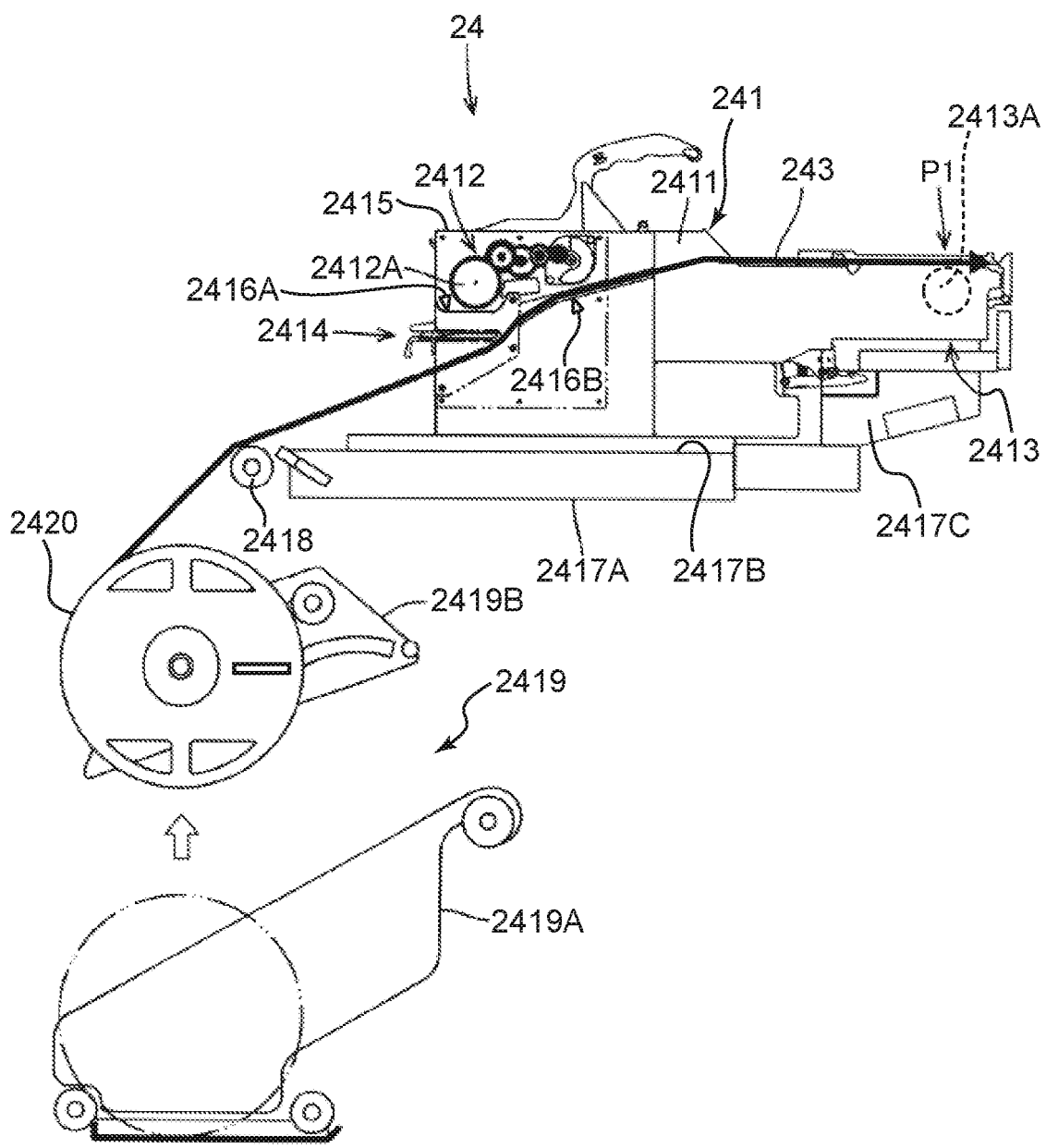
FIG. 4 is an explanatory diagram illustrating a component supply operation in a component supply device of the component supply unit.
Figure 5:
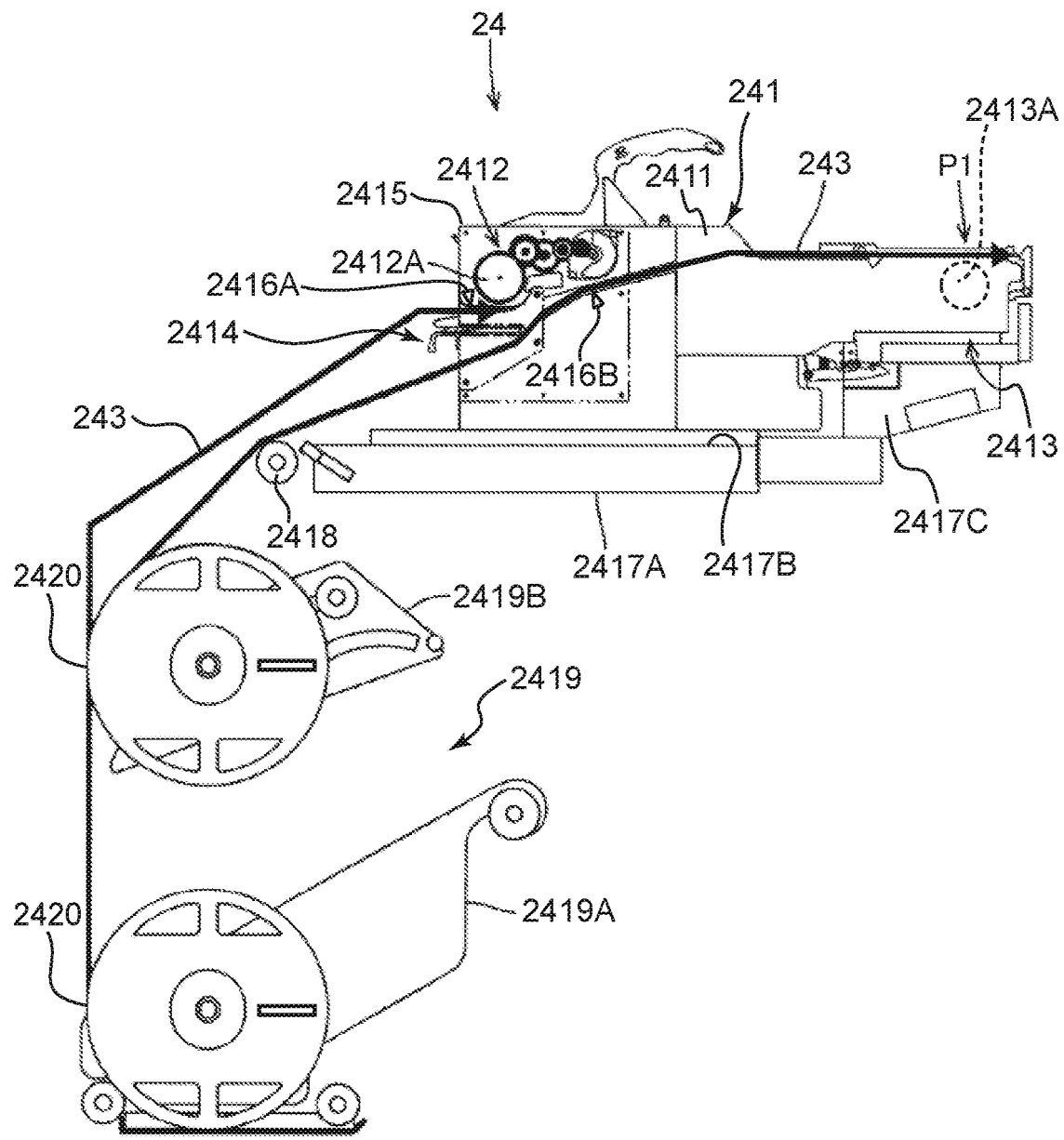
FIG. 5 is an explanatory diagram illustrating a component supply operation in the component supply device of the component supply unit.
Figure 6:
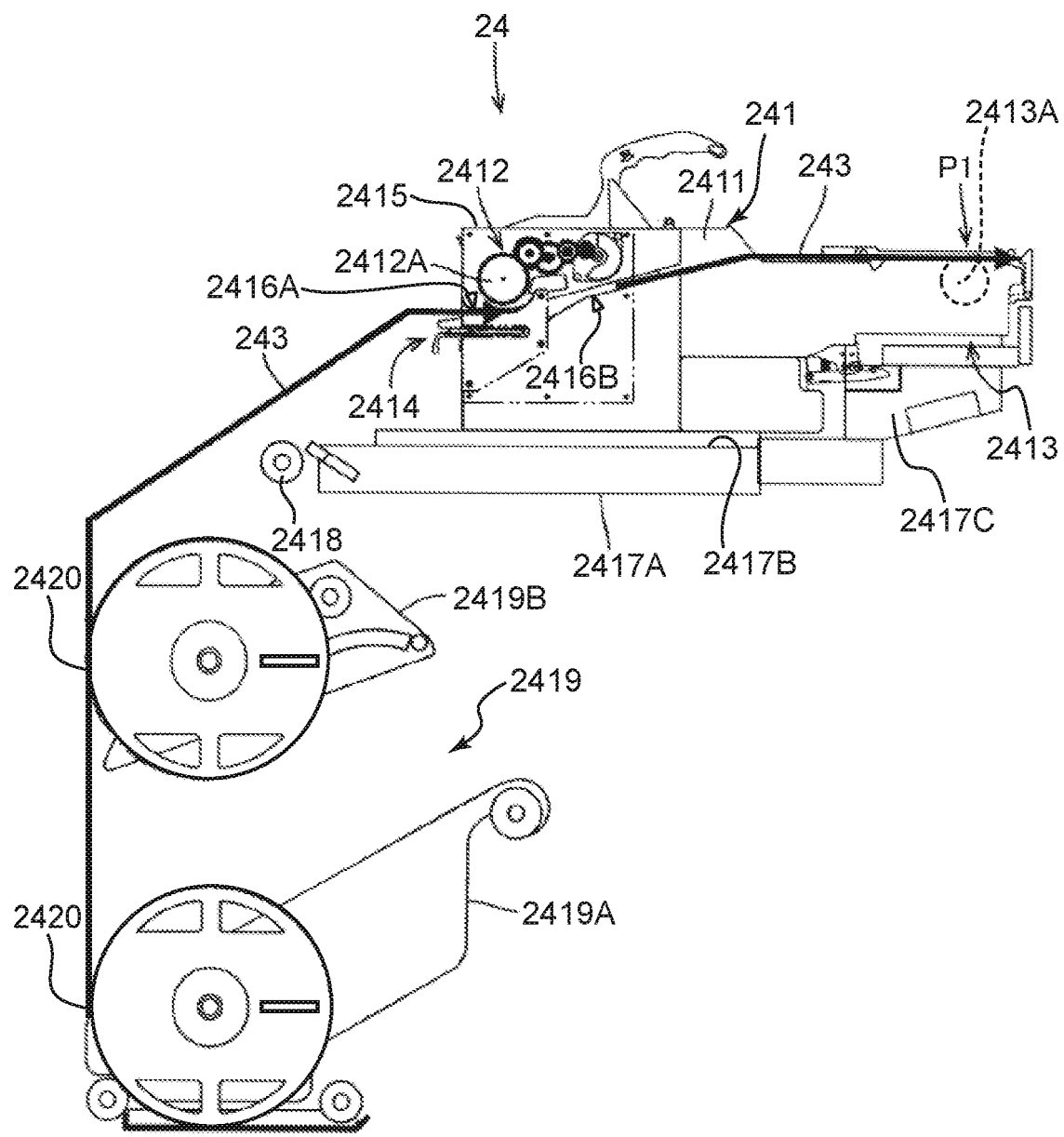
FIG. 6 is an explanatory diagram illustrating a component supply operation in the component supply device of the component supply unit.
Figure 7:
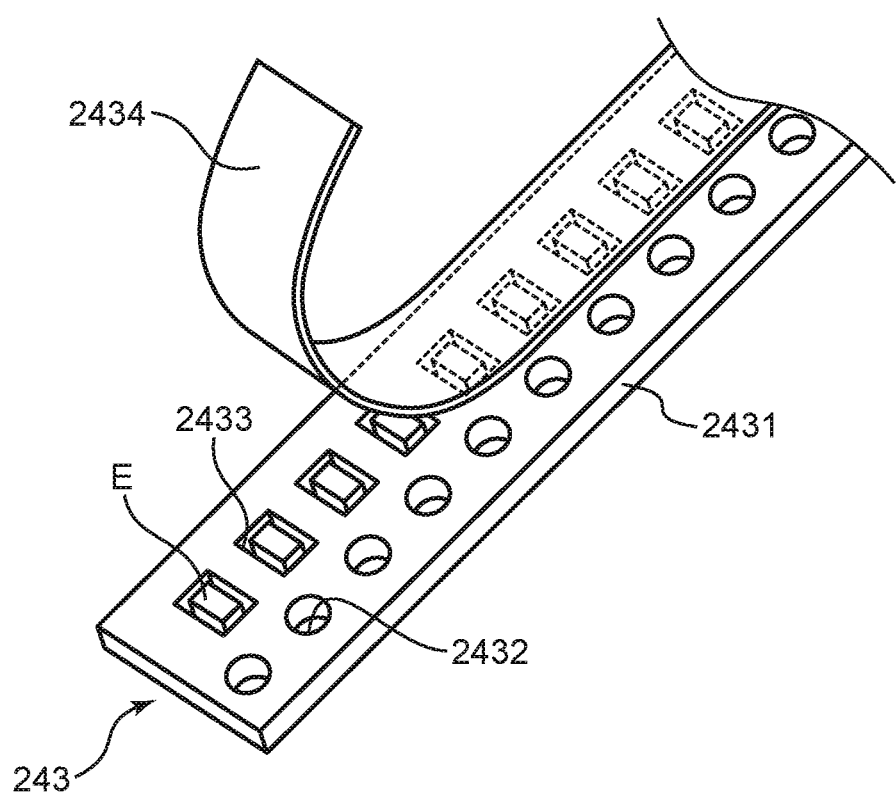
FIG. 7 is a perspective view illustrating a component housing tape to be attached to the component supply device of the component supply unit.

Details of a configuration of the component supply unit 24 including the component supply device 241 will be described with reference to FIGS. 3 to 7. FIG. 3 is a diagram schematically illustrating the configuration of the component supply unit 24 in the mounting machine 2. FIGS. 4 to 6 are explanatory diagrams illustrating a component supply operation in the component supply device 241 of the component supply unit 24. FIG. 7 is a perspective view illustrating a component housing tape 243 to be attached to the component supply device 241 in the component supply unit 24.

The four component supply units 24 respectively disposed on four places of the main body frame 21 each include the plurality of component supply devices 241 disposed in parallel on a carriage 242. A plurality of reels 2420 around which the component housing tapes 243 are wound, respectively, are attachable to the component supply devices 241 including the ALFs, respectively.

Prior to the description about the configuration of the component supply device 241, the component housing tape 243 will be described with reference to FIG. 7. The component housing tape 243 includes a carrier tape 2431 and a cover tape 2434. The carrier tape 2431 is a tape on which a plurality of component housing portions 2433 for housing components E respectively are arranged at predetermined intervals. The carrier tape 2431 includes conveyance force transmission holes 2432 which are arranged on its one edge in a widthwise direction at predetermined intervals. Teeth portions of a first sprocket 2412A and a second sprocket 2413A in the component supply device 241, described later, are fitted into the conveyance force transmission holes 2432, respectively, and a conveyance force for feeding the component housing tape 243 is transmitted to the conveyance force transmission holes 2432 by the first sprocket 2412A and second sprocket 2413A. The cover tape 2434 is a tape which affixed to the carrier tape 2431 to cover the component housing portions 2433.

As illustrated in FIG. 3, the component supply device 241 is installed in a feeder installation portion 2417A disposed in the component supply unit 24. More specifically, the component supply unit 24 includes the feeder installation portion 2417A and a reel supporting portion 2419. The feeder installation portion 2417A includes a plurality of slots 2417B which are disposed in the X axis direction at fixed intervals and extends in the Y axis direction in parallel with each other, and a fixing pedestal 2417C which extends in the X axis direction in a position on a front side relative to the slots 2417B. The component supply device 241 is set on each of the slots 2417B, and the respective component supply devices 241 are fixed to the fixing pedestal 2417C. As a result, in the component supply unit 24, the plurality of component supply devices 241 are disposed in parallel on the carriage 242.

The reel supporting portion 2419, which is in a position on a lower rear side relative to the feeder installation portion 2417A, supports a first reel holder 2419A and a second reel holder 2419B which rotatably support the reel 2420, so that these holders are vertically separated from each other. The component housing tape 243 is wound around the reel 2420 supported by the first reel holder 2419A and the second reel holder 2419B.

The component supply device 241 includes a feeder main body 2411. The component supply device 241 is fixed to the fixing pedestal 2417C with the feeder main body 2411 being inserted (set) into the slots 2417B. The first sprocket 2412A and the second sprocket 2413A are rotatably supported to the feeder main body 2411 so that the second sprocket 2413A is away from the reel supporting portion 2419 in the Y axis direction with respect to the first sprocket 2412A. The first sprocket 2412A configures a first tape feeding unit 2412, and the second sprocket 2413A configures a second tape feeding unit 2413. The first sprocket 2412A and the second sprocket 2413A each include a plurality of teeth portions disposed in a circumferential direction at predetermined intervals. The teeth portions of the first sprocket 2412A and the second sprocket 2413A can be fitted into the conveyance force transmission holes 2432 formed on the carrier tape 2431 of the component housing tape 243.

The component housing tape 243, which is wound around the reel 2420 supported by the first reel holder 2419A and the second reel holder 2419B, is guided by a guide roller 2418 disposed on an upper end of the reel supporting portion 2419 and simultaneously led to the first sprocket 2412A and the second sprocket 2413A. With the teeth portions of the first sprocket 2412A and the second sprocket 2413A being fitted into the conveyance force transmission holes 2432, the component housing tape 243 is fed by the rotation of the first sprocket 2412A and the second sprocket 2413A, and the component E is taken out in a component supply position P1.

The component supply device 241 further includes a tape supporting member 2414 which is detachably fixed to a rear end of the feeder main body 2411, an operation input unit 2415 which is disposed on an upper rear surface of the feeder main body 2411, and first and second tape detecting sensors 2416A and 2416B.

The tape supporting member 2414, as illustrated in FIG. 3, divides a rear end of a tape transport path 2414A where the component housing tape 243 travels in the feeder main body 2411 into two up and down paths (an upper path 2414AA and a lower path 2414AB), and supports the component housing tape 243 which passes through the upper path 2414AA from below. As for details, the rear end of the tape transport path 2414A has a shape which becomes vertically wider toward a rear side from a front side. The tape supporting member 2414 is inserted into the tape transport path 2414A through a rear portion of the feeder main body 2411, and is detachably fixed to the feeder main body 2411. In such a manner, the tape supporting member 2414 divides the rear end of the tape transport path 2414A into the upper path 2414AA and the lower path 2414AB.

The first tape detecting sensor 2416A and the second tape detecting sensor 2416B are disposed to face the tape transport path 2414A and detect presence and absence of the component housing tape 243 which passes through the tape transport path 2414A. More specifically, the first tape detecting sensor 2416A is disposed on a front side relative to a merging portion of the upper path 2414AA and the lower path 2414AB so as to face the tape transport path 2414A from below. On the other hand, the second tape detecting sensor 2416B is disposed to face the upper path 2414AA from above, and thus detects presence and absence of the component housing tape 243 on the upper path 2414AA.

The operation input unit 2415 is used by the operator if necessary to feed and reversely feed the component housing tape 243.

The component supply operation for the component supply device 241 having the above configuration will be described below with reference to FIGS. 3 to 6. In the preparation operation, the operator mounts the reel 2420 around which the precedent component housing tape 243 is wound to the first reel holder 2419A at a lower stage of the reel supporting portion 2419, and inserts the front end of the component housing tape 243 wound around that reel 2420 into the upper path 2414AA through the rear portion of the feeder main body 2411. This insertion allows the front end of the precedent component housing tape 243 to be supported by the tape supporting member 2414 with the front end being fitted to the first sprocket 2412A. The operator then operates the operation input unit 2415 to input an instruction of rotating the first sprocket 2412A and feed the component housing tape 243 so that the front end of the component housing tape 243 is fitted to the second sprocket 2413A.

With the preparation operation being completed, the component supply operation for the component supply device 241 starts. In the component supply device 241, the second sprocket 2413A rotates to feed the component housing tape 243. The first sprocket 2412A, which is configured to turn free, enables the component housing tape 243 to be fed only by rotating the second sprocket 2413A.

With the precedent component housing tape 243 being fed from the reel 2420, the operator then removes the tape supporting member 2414 from the feeder main body 2411. Upon the removal of the tape supporting member 2414, as illustrated in FIG. 3, the component housing tape 243 shifts to a bottom surface of the tape transport path 2414A due to its self weight. This shift causes the precedent component housing tape 243 to be released from the first sprocket 2412A. With the component housing tape 243 being fitted to the second sprocket 2413A, if being released from the first sprocket 2412A, the component housing tape 243 is continuously fed by the rotation of the second sprocket 2413A.

With the precedent component housing tape 243 being fed from the reel 2420, the operator attaches the tape supporting member 2414 to the feeder main body 2411, and, as illustrated in FIG. 4, moves the reel 2420 around which the precedent component housing tape 243 is wound from the first reel holder 2419A at the lower stage to the second reel holder 2419B at the upper stage. With the precedent component housing tape 243 being fed from the reel 2420 supported by the second reel holder 2419B at the upper stage, the operator then, as illustrated in FIG. 5, attaches the reel 2420 around which the subsequent component housing tape 243 is wound to the first reel holder 2419A at the lower stage, and inserts the front end of the subsequent component housing tape 243 into the upper path 2414AA through the rear portion of the feeder main body 2411. Accordingly, with the front end of the subsequent component housing tape 243 being fitted to the first sprocket 2412, the subsequent component housing tape 243 is supported by the tape supporting member 2414. In such a manner, with absence of the components in the precedent component housing tape 243 wound around the reel 2420 being prevented, the operator can attach the reel 2420 around which the subsequent component housing tape 243 is wound.

The precedent component housing tape 243 is, then, entirely pulled out of the reel 2420 supported by the second reel holder 2419B at the upper stage, and, as illustrated in FIG. 6, its rear end passes through the second tape detecting sensor 2416B. When the second tape detecting sensor 2416B detects absence of the precedent component housing tape 243, the subsequent component housing tape 243 automatically starts to be fed from the reel 2420 supported by the first reel holder 2419A at the lower stage. The operator then removes the reel 2420 having no components from the second reel holder 2419B at the upper stage, and moves the reel 2420 around which the subsequent component housing tape 243 is wound from the first reel holder 2419A at the lower stage to the second reel holder 2419B at the upper stage. At this time, the operator can refill the component supply device 241 with a new reel around which the component housing tape 243 is wound. The operator attaches the new reel, with which the component supply device 241 is refilled, to the first reel holder 2419A at the lower stage. The component refill management system 3 specifies the refill timing for the new reel with the refill timing not being limited to the time when the reel 2420 around which the precedent component housing tape 243 is wound has no component.

A new reel cannot be attached in a state illustrated in FIG. 5 in which the precedent component housing tape 243 is fed from the reel 2420 supported by the second reel holder 2419B at the upper stage and the front end of the subsequent component housing tape 243 wound around the reel 2420 supported by the first reel holder 2419A at the lower stage is inserted into the upper path 2414AA. On the other hand, a new reel can be attached in a state illustrated in FIG. 6 in which the precedent component housing tape 243 is entirely pulled out of the reel 2420 supported by the second reel holder 2419B at the upper stage and the subsequent component housing tape 243 automatically starts to be fed from the reel 2420 supported by the first reel holder 2419A at the lower stage.

<Configuration of Component Refill Management System>

Figure 8:
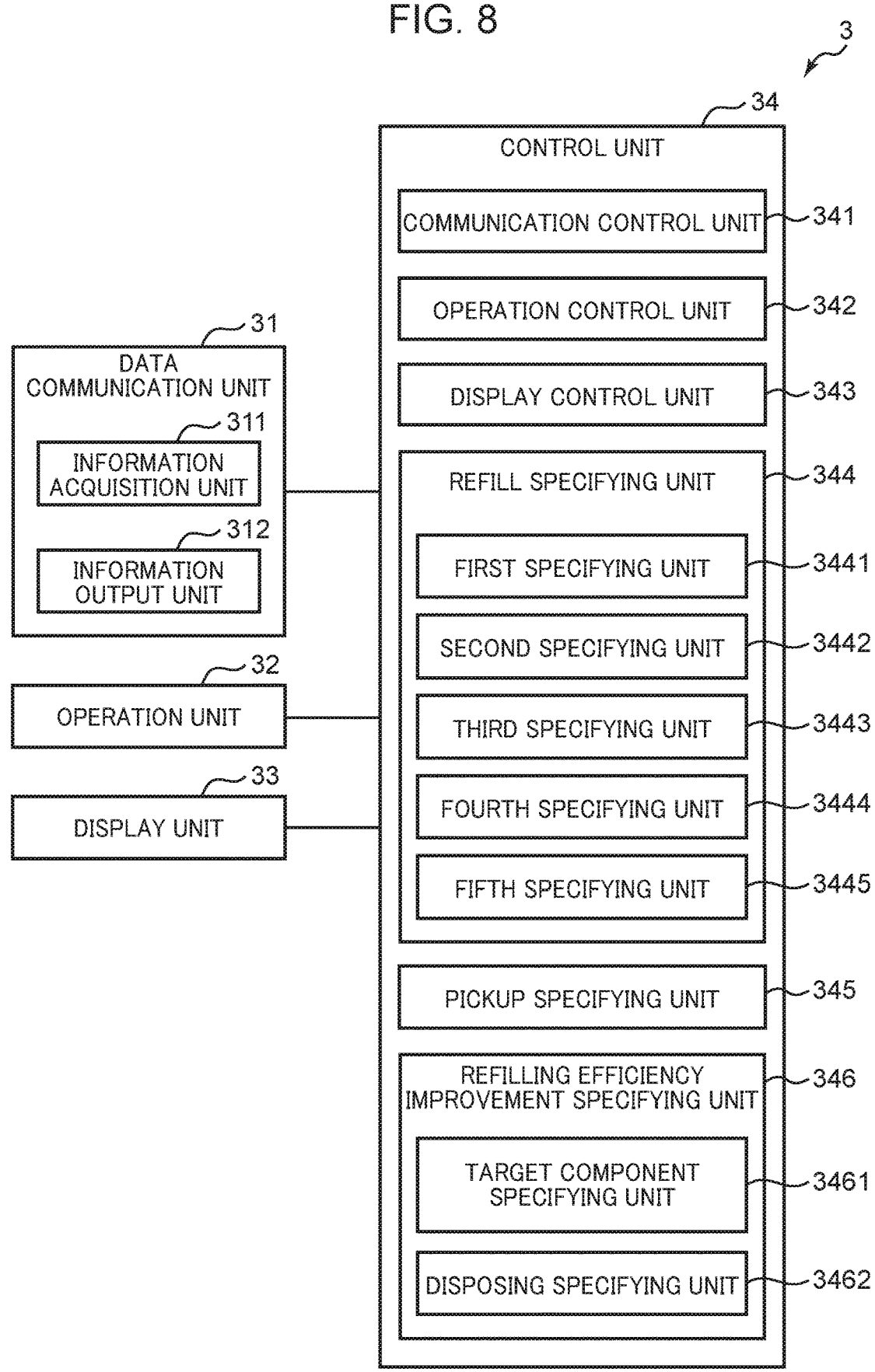
FIG. 8 is a block diagram illustrating a configuration of a component refill management system.

The component refill management system 3 manages refilling for a reel as the component housing member in each of the plurality of component supply devices 241 installed in the component supply unit 24. The component refill management system 3 does not individually specify refill timings for reels in the component supply devices 241 but enables the reel refilling operations to be performed collectively in the component supply devices 241 which can be refilled with reels at an identical refill timing, namely, enables "collective refill" to reduce the refilling operation burden on the operator. A configuration of the component refill management system 3 will be described with reference to FIG. 8 as well as FIG. 1. FIG. 8 is a block diagram illustrating the configuration of the component refill management system 3.

The component refill management system 3 is, as illustrated in FIG. 1, data-communicably connected to the mounting machine operation management device 4, the production plan management device 5, the preparation management device 6, the component unloading management device 7, and the component refilling efficiency improvement management device 8. The component refill management system 3 further includes, for example, a microcomputer, and thus includes a data communication unit 31, an operation unit 32, a display unit 33, and a control unit 34 as illustrated in FIG. 8.

In the component refill management system 3, the operation unit 32, which includes a touch panel, ten keys, a start key, a setting key, and the like, accepts operator's operations on the component refill management system 3 and various settings. The display unit 33 displays specified result information to be generated by a refill specifying unit 344, a pickup specifying unit 345, and a refilling efficiency improvement specifying unit 346 of the control unit 34, described later.

The data communication unit 31 is an interface circuit for achieving data communication with the mounting machine operation management device 4, the production plan management device 5, the preparation management device 6, the component unloading management device 7, and the component refilling efficiency improvement management device 8. The data communication unit 31 includes an information acquisition unit 311 and an information output unit 312. The information acquisition unit 311 acquires information to be transmitted from the mounting machine operation management device 4, the production plan management device 5, the preparation management device 6, the component unloading management device 7, and the component refilling efficiency improvement management device 8, and transmits the acquired information to the control unit 34. The information output unit 312 receives the specified result information to be generated by the refill specifying unit 344, the pickup specifying unit 345, and the refilling efficiency improvement specifying unit 346 from the control unit 34, and transmits (outputs) the specified result information to the mounting machine operation management device 4, the production plan management device 5, the preparation management device 6, the component unloading management device 7, and the component refilling efficiency improvement management device 8.

The mounting machine operation management device 4, the production plan management device 5, the preparation management device 6, the component unloading management device 7, and the component refilling efficiency improvement management device 8, which are data-communicably connected to the component refill management system 3 will be described herein.

The mounting machine operation management device 4, which is installed near the mounting board production line in which the mounting machine 2 is disposed, manages the mounting operation of the mounting machine 2. The mounting machine operation management device 4 is, for example, a microcomputer. The production line operator operates the mounting machine operation management device 4 to control the mounting operation of the mounting machine 2. The mounting machine operation management device 4 transmits residual component number information to the component refill management system 3 in response to the operation by the production line operator. The residual component number information is information relating to a sum of the residual components E housed in the component housing tape 243 wound around the reel 2420 attached to the first reel holder 2419A and the second reel holder 2419B respectively in each of the component supply devices 241. The residual component number information transmitted from the mounting machine operation management device 4 is input into the component refill management system 3 via the information acquisition unit 311 of the data communication unit 31. The residual component number information may be transmitted from the preparation management device 6, described later. The mounting machine operation management device 4 receives the specified result information which is transmitted from the component refill management system 3 via the information output unit 312 of the data communication unit 31 and is generated by the refill specifying unit 344, described later. The production line operator takes the reel out of a component storage unit 20 installed near the mounting machine 2, based on the specified result information input into the mounting machine operation management device 4, and performs a reel refilling operation on the component supply devices 241.

The production plan management device 5 is a device that manages a mounting board production plan for the mounting machine 2. The production plan management device 5, which is, for example, a microcomputer, transmits production plan information relating to the mounting board production plan to the component refill management system 3 in response to the operation by the operator who creates a production plan. FIG. 9 is a diagram describing production plan information JH1 which is transmitted from the production plan management device 5 and is input into the component refill management system 3. The production plan information JH1, which is transmitted from the production plan management device 5 and is input into the component refill management system 3 via the information acquisition unit 311 of the data communication unit 31, is information including at least component necessary number information JH143 and cycle time information JH144. The component necessary number information JH143 is information relating to a necessary number of the components E (number per board) necessary for producing one mounting board. The cycle time information JH144 is information relating to a time (second per board) necessary for mounting the components E during the production of one mounting board.

Specifically, as illustrated in FIG. 9, the production plan information JH1 is information in which board information JH11 for specifying a board P provided for producing a mounting board, production number information JH12 representing a number of mounting boards to be produced, production order information JH13 representing a production order of a mounting board, and used component information JH14 relating to the components E to be used for producing a mounting board are associated. The used component information JH14 is information in which component identification information JH141 for identifying the component E, component type specifying information JH142 for specifying the component E, the component necessary number information JH143, and the cycle time information JH144 are associated. The component necessary number information JH143 is set for each component identified by the component identification information JH141. The cycle time information JH144 is set for each board specified by the board information JH11. In description with reference to FIG. 9, a cycle time represented by the cycle time information JH144 is an identical value ("AAA1") for each component ("IA1", "IA2") identified by the component identification information JH141 in one "board A" specified by the board information JH11. For a different board, a value corresponding to that board is set.

The preparation management device 6 is a device that manages the preparation operation necessary for production before production of mounting boards using the mounting machine 2. The preparation management device 6, which is, for example, a microcomputer, outputs preparation information necessary for the preparation operation. The operator performs the preparation operation based on the output information from the preparation management device 6. The preparation management device 6 transmits the preparation information to the component refill management system 3 in response to an operator's operation. FIG. 10 is a diagram describing the preparation information JH2 which is transmitted from the preparation management device 6 and is input into the component refill management system 3. The preparation information JH2, which is transmitted from the preparation management device 6 and is input into the component refill management system 3 via the information acquisition unit 311 of the data communication unit 31, may be information including residual component number information JH24. The residual component number information JH24 is, as described above, information relating to the sum of residual components E housed in the component housing tape 243 wound around the reel 2420 attached to the first reel holder 2419A and the second reel holder 2419B respectively in each of the component supply devices 241. In the present embodiment, the residual component number information JH24 is transmitted from the mounting machine operation management device 4.

Specifically, as illustrated in FIG. 10, the preparation information JH2 is information in which the board information JH11, carriage identification information JH21, feeder identification information JH22, reel identification information JH23, the component identification information JH141, the residual component number information JH24, and residual component number warning value information JH25 are associated. The carriage identification information JH21 is information for identifying the carriage 242 on which the plurality of component supply devices 241 are disposed in parallel in the component supply unit 24. The feeder identification information JH22 is information for identifying the component supply device 241. The reel identification information JH23 is information for identifying the reels 2420 attached to the first reel holder 2419A and the second reel holder 2419B, respectively, in the component supply device 241. The residual component number warning value information JH25 is information representing that the sum of residual components represented by the residual component number information JH24 before the component housing tape 243, which is wound around the reel 2420 attached to each of the first reel holder 2419A and the second reel holder 2419B, houses no component E indicates a predetermined value to be warned (residual component number warning value).

The component unloading management device 7 is a device which is disposed in a component storage that stores reels or the like to be attached to the component supply devices 241, and manages unloading of various components from the component storage. The component unloading management device 7, which is, for example, a microcomputer, is operated by a component storage operator. The component unloading management device 7 receives specified result information which is transmitted from the component refill management system 3 via the information output unit 312 of the data communication unit 31 and is generated by the pickup specifying unit 345, described later. The component storage operator unloads the reels or the like from the component storage and houses them in the component storage unit 20 installed near the mounting machine 2, based on the specified result information input into the component unloading management device 7 to collect the reels or the like in the component storage unit 20.

The component refilling efficiency improvement management device 8, which is, for example, a microcomputer, is operated by an operator who plans refilling efficiency of the reels in the component supply devices 241. The component refilling efficiency improvement management device 8 receives specified result information which is transmitted from the component refill management system 3 via the information output unit 312 of the data communication unit 31 and is generated by the refilling efficiency improvement specifying unit 346, described later. The operator can plan a countermeasure for improving the refilling efficiency of the reels in the component supply devices 241, based on the specified result information input into the component refilling efficiency improvement management device 8.

In the component refill management system 3, the control unit 34 includes, for example, a central processing unit (CPU), a read only memory (ROM) that stores a control program, and a random access memory (RAM) that is used as an operation area of the CPU. In the control unit 34, the CPU executes the control program stored in the ROM to control the data communication unit 31, the operation unit 32, and the display unit 33, and generate various specified result information relating to the reel refill for the plurality of component supply devices 241 disposed in the component supply unit 24. The control unit 34 includes, as illustrated in FIG. 8, a communication control unit 341, an operation control unit 342, a display control unit 343, the refill specifying unit 344, the pickup specifying unit 345, and the refilling efficiency improvement specifying unit 346.

The communication control unit 341 controls data communication, which is performed by the data communication unit 31, with the mounting machine operation management device 4, the production plan management device 5, the preparation management device 6, the component unloading management device 7, and the component refilling efficiency improvement management device 8. The operation control unit 342 controls the operation unit 32. The display control unit 343 controls information display operations to be performed by the display unit 33.

The refill specifying unit 344 specifies the component supply device 241 which is to be refilled with a new reel and also its refill timing based on the information transmitted to the control unit 34 from the information acquisition unit 311 of the data communication unit 31 including the residual component number information JH24 from the mounting machine operation management device 4 (or the preparation management device 6), the production plan information JH1 from the production plan management device 5, and the preparation information JH2 from the preparation management device 6.

Figure 11:
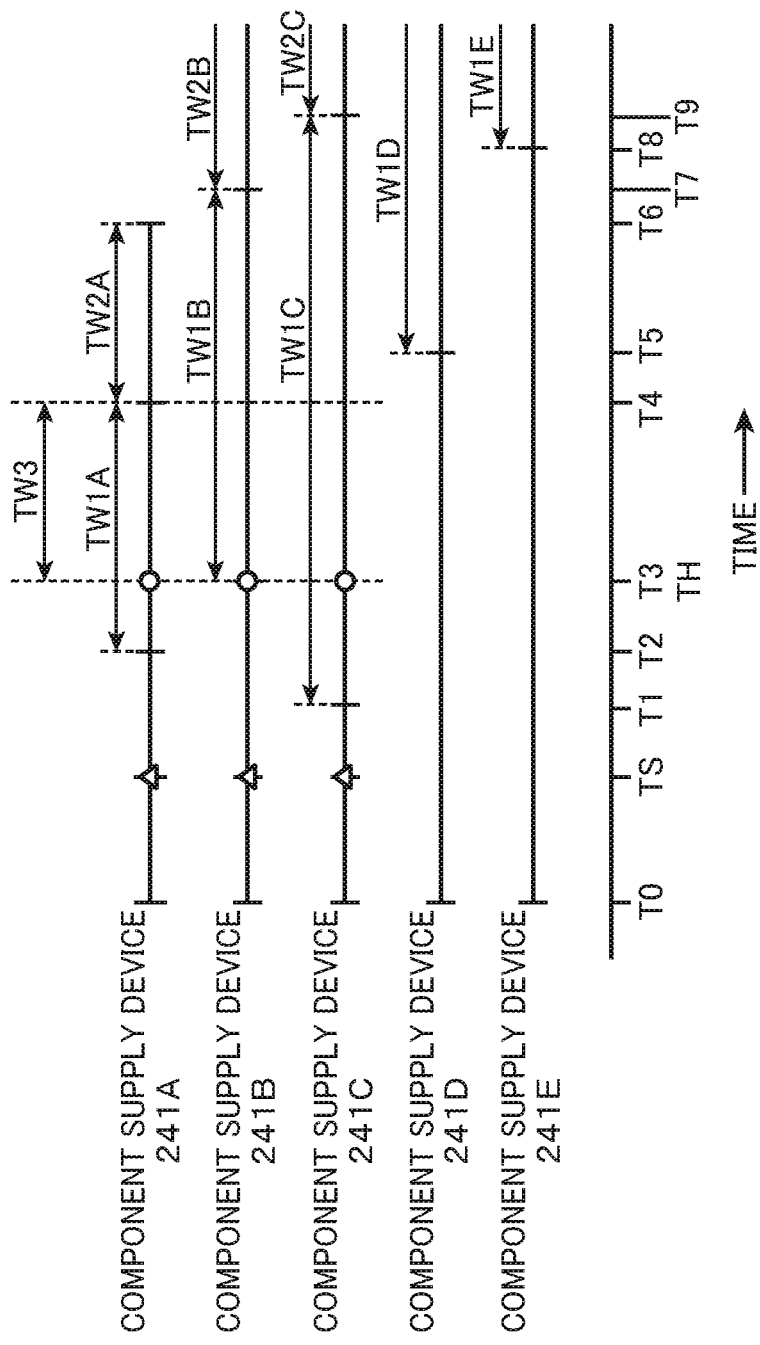
FIG. 11 is a diagram describing an operation of a refill specifying unit in the component refill management system.

The refill specifying unit 344 includes a first specifying unit 3441, a second specifying unit 3442, a third specifying unit 3443, a fourth specifying unit 3444, and a fifth specifying unit 3445. A configuration of the refill specifying unit 344 will be described with reference to FIG. 11 as well as FIG. 8. FIG. 11 is a diagram describing an operation of the refill specifying unit 344 in the component refill management system 3. FIG. 11 illustrates an example in which components are supplied from the five component supply devices 241A, 241B, 241C, 241D, and 241E in the plurality of component supply devices 241 disposed in parallel on the carriage 242 of each of the component supply units 24, and production of mounting boards starts at time T0.

The first specifying unit 3441 of the refill specifying unit 344 specifies a refillable time interval TW1A representing a time interval during which a new reel is refillable between a first time T2 and a second time T4 so that refillable time interval TW1A is associated with the component supply device 241A. At the first time T2, in the component supply device 241A, the reel 2420, as one component housing member, from which components are precedently supplied and around which the precedent component housing tape 243 is wound has no component in the reels 2420 attached to the first reel holder 2419A and the second reel holder 2419B. At the second time T4, the sum of residual components represented by the residual component number information JH24 reaches a predetermined residual component number warning value represented by the residual component number warning value information JH25.

Specifically, the first specifying unit 3441 first subtracts the number of residual components in the reel 2420 around which the subsequent component housing tape 243 is wound from the sum of residual components represented by the residual component number information JH24 to obtain a number of residual components in the reel 2420 around which the precedent component housing tape 243 is wound. The first specifying unit 3441 further divides a necessary number of components, which is represented by component necessary number information JH143 and is identified by the component identification information JH141 necessary for producing one mounting board, by a component mounting time, represented by the cycle time information JH144, in the production of one mounting board specified by the board information JH11 so as to obtain a number of components used per second. The first specifying unit 3441 divides the number of residual components in the reel 2420 around which the precedent component housing tape 243 is wound by the number of components used per second to obtain the first time T2. On the other hand, the first specifying unit 3441 divides a number of components, which has been obtained by subtracting the residual component number warning value represented by the residual component number warning value information JH25 from the sum of residual components represented by the residual component number information JH24, by the number of components used per second so as to obtain the second time T4. The first specifying unit 3441 specifies the refillable time interval TW1A by using the first time T2 and the second time T4 obtained by above described manner with the refillable time interval TW1A being associated with the component supply device 241A.

The sum of residual components represented by the residual component number information JH24 is subtracted every time when a component is taken out by the head unit 25. As will described in detail later, when the reel 2420 around which the precedent component housing tape 243 is wound has no component and the component supply device 241A is refilled with a new reel, a number of components housed in the component housing tape 243 wound around the new reel (an initial set number) is added to the sum of residual components which changes every time when a component is taken out by the head unit 25, so that the sum of residual components is updated. The number of components housed in the component housing tape 243 wound around the new reel (the initial set number) is stored in, for example, the ROM of the control unit 34 for each component identified by the component identification information JH141. When the component supply device 241A is refilled with the reel, around which the component housing tape 243 in use is wound, as the new reel, the initial set number stored in, for example, the ROM of the control unit 34 is rewritten to an actual number of components housed in that component housing tape 243.

The first specifying unit 3441 specifies a refillable time interval TW1B representing a time interval during which a new reel is refillable between a first time T3 and a second time T7 in the component supply device 241B so that the refillable time interval TW1B is associated with the component supply device 241B similarly in the case of the component supply device 241A. At the first time T3, the reel 2420, as one component housing member, around which the precedent component housing tape 243 is wound has no component. At the second time T7, the sum of residual components represented by the residual component number information JH24 reaches a predetermined residual component number warning value represented by the residual component number warning value information JH25.

The first specifying unit 3441 specifies a refillable time interval TW1C representing a time interval during which a new reel is refillable between a first time T1 and a second time T9 in the component supply device 241C so that the refillable time interval TW1C is associated with the component supply device 241C similarly in the case of the component supply device 241A. At the first time T1, the reel 2420, as one component housing member, around which the precedent component housing tape 243 is wound has no component. At the second time T9, the sum of residual components represented by the residual component number information JH24 reaches a predetermined residual component number warning value represented by the residual component number warning value information JH25.

The first specifying unit 3441 specifies a refillable time interval TW1D representing a refillable time interval during which a new reel is refillable between a first time T5 and a second time in the component supply device 241D so that the refillable time interval TW1D is associated with the component supply device 241D similarly in the case of the component supply device 241A. At the first time T5, the reel 2420, as one component housing member, around which the precedent component housing tape 243 is wound has no component. At the second time, the sum of residual components represented by the residual component number information JH24 reaches a predetermined residual component number warning value represented by the residual component number warning value information JH25.

The first specifying unit 3441 further specifies a refillable time interval TW1E representing a refillable time interval during which a new reel is refillable between a first time T8 and a second time in the component supply device 241E so that the refillable time interval TW1E is associated with the component supply device 241E similarly in the case of the component supply device 241A. At the first time T8, the reel 2420, as one component housing member, around which the precedent component housing tape 243 is wound has no component. At the second time, the sum of residual components represented by the residual component number information JH24 reaches a predetermined residual component number warning value represented by the residual component number warning value information JH25.

The second specifying unit 3442 of the refill specifying unit 344 recognizes the refillable time interval TW1A in which the second time is the earliest among the refillable time intervals TW1A, TW1B, TW1C, TW1D, and TW1E specified by the first specifying unit 3441, as a first refillable time interval. The second specifying unit 3442 specifies the component supply device 241A, which is associated with the first refillable time interval TW1A, as a first component supply device which is to be preferentially refilled with a new reel.

The third specifying unit 3443 of the refill specifying unit 344 specifies the component supply devices 241B and 241C, which are other than the component supply device 241A and can be refilled with new reels within the first refillable time interval TW1A recognized by the second specifying unit 3442, as second component supply devices with reference to the refillable time intervals TW1A, TW1B, TW1C, TW1D, and TW1E specified by the first specifying unit 3441.

More specifically, the third specifying unit 3443 recognizes, among the refillable time intervals TW1A, TW1B, TW1C, TW1D, and TW1E, all the second refillable time intervals TW1B and TW1C, which are selected from the residual refillable time intervals TW1B, TW1C, TW1D, and TW1E other than the first refillable time interval TW1A and are included in the time interval having the second time T4 of the first refillable time interval TW1A, and specifies all the component supply devices 241B and 241C, which are associated with the second refillable time intervals TW1B and TW1C, as the second component supply devices.

The fourth specifying unit 3444 of the refill specifying unit 344 specifies an identical new reel refill timing TH within the first refillable time interval TW for the first component supply device 241A specified by the second specifying unit 3442 and the second component supply devices 241B and 241C specified by the third specifying unit 3443.

More specifically, the fourth specifying unit 3444 recognizes an overlapped time interval TW3 in which the first refillable time interval TW1A recognized by the second specifying unit 3442 overlaps the second refillable time intervals TW1B and TW1C specified by the third specifying unit 3443. The fourth specifying unit 3444 specifies a predetermined time within the overlapped time interval TW3 as the identical refill timing TH for the first component supply device 241A and the second component supply devices 241B and 241C. In the present embodiment, the fourth specifying unit 3444 is configured to specify the time T3, which is the earliest in the overlapped time interval TW3, as the refill timing TH.

The fourth specifying unit 3444 recognizes an overlapped time interval selected from the refillable time intervals TW1D and TW1E also for the component supply devices 241D and 241E, and specifies a predetermined time, which is different from the time T3 within the overlapped time interval, as the identical refill timing for the component supply devices 241D and 241E. Alternatively, the fourth specifying unit 3444 recognizes an overlapped time interval including the refillable time intervals for the other component supply devices 241 in some cases. After the component supply devices 241A, 241B, and 241C are refilled with components at the time T3 (the refill timing TH), as described above, the first specifying unit 3441 estimates a time at which the precedent component housing tape 243 has no component at that time and specifies respective refillable time intervals. The fourth specifying unit 3444 recognizes the overlapped time interval based on the refillable time intervals, and specifies a new refill timing within the overlapped time interval.

A period during which the refill specifying unit 344 performs calculation to specify the refillable time interval, the overlapped time interval, and the refill timing starts at the time T0 at which the production of a mounting board starts, but may start in the middle of the production. For example, if receiving instruction information for instructing the start of calculation performed by the refill specifying unit 344 via the operation unit 32 at any time after the time T0, the refill specifying unit 344 may be configured to specify the refillable time interval, the overlapped time interval, and the refill timing based on the residual component number information JH24, the production plan information JH1, the preparation information JH2, and the like with the period after the time of the reception of the instruction information being a calculation period.

The refill specifying unit 344 may specify the refillable time interval, the overlapped time interval, and the refill timing for only the component supply devices 241 in the identical mounting machine 2 or for the component supply devices 241 in different mounting machines 2.

The fifth specifying unit 3445 of the refill specifying unit 344 specifies, in the component supply device 241A, a residual component number warning time interval TW2A, which represents a time interval during which the number of residual components is to be warned, between the second time T4 and a third time T6, represented by the residual component number information JH24, at which the sum of residual components becomes 0 with the residual component number warning time interval TW2A being associated with the component supply device 241A. The fifth specifying unit 3445 specifies, in the component supply device 241B, a residual component number warning time interval TW2B, which represents a time interval during which the number of residual components is to be warned, between the second time T7 and the third time, represented by the residual component number information JH24, at which the sum of residual components becomes 0, with the residual component number warning time interval TW2B being associated with the component supply device 241B. The fifth specifying unit 3445 specifies, in the component supply device 241C, a residual component number warning time interval TW2C, which represents a time interval during which the number of residual components is to be warned, between the second time T9 and the third time, represented by the residual component number information JH24, at which the sum of residual components becomes 0, with residual component number warning time interval TW2C being associated with the component supply device 241C. The fifth specifying unit 3445 further specifies, in the component supply devices 241D and 241E, a residual component number warning time interval, which represents a time interval during which the number of residual components is to be warned, between the second time and the third time, represented by the residual component number information JH24, at which the sum of residual components becomes 0, with the residual component number warning time interval being associated with the component supply devices 241D and 241E.

Figure 12:
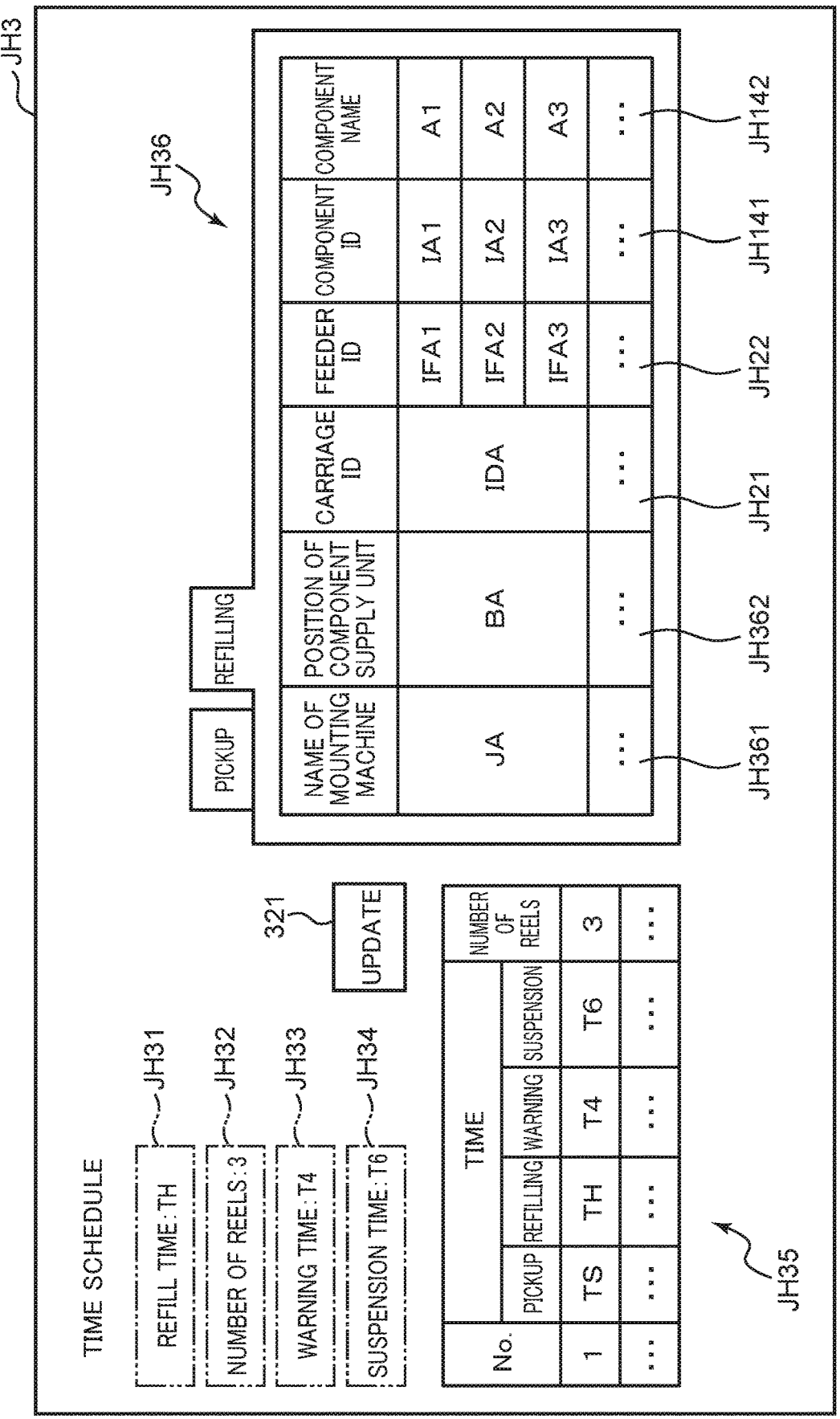
FIG. 12 is a diagram describing refill specified result information generated by the refill specifying unit in the component refill management system.

The refill specifying unit 344 including the first specifying unit 3441, the second specifying unit 3442, the third specifying unit 3443, the fourth specifying unit 3444, and the fifth specifying unit 3445 generates refill specified result information representing specified results obtained by the specifying units. FIG. 12 is a diagram describing refill specified result information JH3 generated by the refill specifying unit 344 of the component refill management system 3.

The refill specified result information JH3 generated by the refill specifying unit 344 is information including refill timing information JH31, refill number information JH32, warning time information JH33, suspension time information JH34, specified result association information JH35 in which the information JH31 to JH34 are associated, and refill component information JH36.

The refill timing information JH31 included in the refill specified result information JH3 is information representing specified results of the refill timing TH specified by the fourth specifying unit 3444 for the first component supply device 241A and the second component supply devices 241B and 241C. The refill number information JH32 included in the refill specified result information JH3 is information representing a sum of new reels with which the first component supply device 241A specified by the second specifying unit 3442 and the second component supply devices 241B and 241C specified by the third specifying unit 3443 are refilled.

The warning time information JH33 included in the refill specified result information JH3 is information representing the second time T4 within the residual component number warning time interval TW2A associated with the first component supply device 241A specified by the fifth specifying unit 3445, namely, representing the warning time at which the warning of the number of residual components starts. The suspension time information JH34 included in the refill specified result information JH3 is information representing the third time T6 in the residual component number warning time interval TW2A associated with the first component supply device 241A specified by the fifth specifying unit 3445, namely, representing a suspension time at which the sum of residual components becomes 0 and the component supply from the first component supply device 241A is suspended.

The refill component information JH36 included in the refill specified result information JH3 is information relating to new reels with which the first component supply device 241A and the second component supply devices 241B and 241C are to be refilled at the refill timing TH specified by the fourth specifying unit 3444. The refill component information JH36 is information, as illustrated in FIG. 12, in which mounting machine type specifying information JH361, component supply unit position information JH362, the carriage identification information JH21, the feeder identification information JH22, the component identification information JH141, and the component type specifying information JH142 are associated with one another. The mounting machine type specifying information JH361 is information for specifying the mounting machine 2 mounted with the first component supply device 241A and the second component supply devices 241B and 241C which are to be refilled with new reels at the refill timing TH. The component supply unit position information JH362 is information for specifying a disposing position of the component supply unit 24 including the first component supply device 241A and the second component supply devices 241B and 241C in the mounting machine 2.

The refill specified result information JH3, which has been generated by the refill specifying unit 344 based on the specified results obtained by the first specifying unit 3441, the second specifying unit 3442, the third specifying unit 3443, the fourth specifying unit 3444, and the fifth specifying unit 3445 are displayed on the display unit 33 controlled by the display control unit 343. As illustrated in FIG. 12, an update operation area 321 partially constituting the operation unit 32, which accepts an operation on the component refill management system 3 from an operator, is set on a display screen of the display unit 33 on which the refill specified result information JH3 is displayed. An operation on the update operation area 321 by the operator updates the specified results obtained by the first specifying unit 3441, the second specifying unit 3442, the third specifying unit 3443, the fourth specifying unit 3444, and the fifth specifying unit 3445.

The refill specifying unit 344 is configured to generate the refill specified result information JH3 including the refill timing information JH31 representing the refill timing TH specified by the fourth specifying unit 3444, but is not limited to this configuration. For example, the refill specifying unit 344 may be configured to generate the refill specified result information JH3 including information representing the overlapped time interval TW3 to be used by the fourth specifying unit 3444 for specifying the refill timing TH. Alternatively, the refill specifying unit 344 may be configured to generate the refill specified result information JH3 including information representing a refill timing period which is a predetermined period within the overlapped time interval TW3. The refill specified result information JH3 including the information representing the overlapped time interval TW3 or the refill specified result information JH3 including the information representing the refill timing period are displayed on the display unit 33 controlled by the display control unit 343.

The refill specified result information JH3 generated by the refill specifying unit 344 is transmitted to the information output unit 312 of the data communication unit 31, is controlled by the communication control unit 341 and is transmitted from the information output unit 312 to the mounting machine operation management device 4. The production line operator picks up the reel from the component storage unit 20 installed near the mounting machine 2, based on the refill specified result information JH3 which is transmitted from the information output unit 312 and input into the mounting machine operation management device 4, to refill the component supply device 241 with the reel.

In the component refill management system 3, the refill specifying unit 344 does not individually specify new refill timings for the component supply devices 241A, 241B, 241C, 241D, and 241E but enables "collective refilling" in which the operator collectively refills the component supply devices 241A, 241B, and 241C, which can be refilled with new reels at the identical refill timing TH, with new reels. This collective refilling can reduce a frequency with which the operator moves to the mounting machine 2 mounted with the component supply devices 241A, 241B, 241C, 241D, and 241E, and thus reduce a burden of the refilling operation on the operator.

In the component refill management system 3, as described above, the fourth specifying unit 3444 recognizes the overlapped time interval TW3 during which the first refillable time interval TW1A recognized by the second specifying unit 3442, and the second refillable time intervals TW1B and TW1C recognized by the third specifying unit 3443 overlap. The fourth specifying unit 3444 then specifies the time T3, which is the earliest in the overlapped time interval TW3, as the refill timing TH.

The overlapped time interval TW3 is a time interval during which the "collective refilling" in which the operator collectively performs the new reel refilling operation can be performed. When the earliest time within the overlapped time interval TW3 is set as the identical refill timing TH for the first component supply device 241A, and the second component supply devices 241B and 241C, the "collective refilling" can be performed with time to spare being allowed until the second time T4 at which the sum of residual components reaches a predetermined residual component number warning value in the first component supply device 241A.

In the component refill management system 3, as described above, the fifth specifying unit 3445 specifies residual component number warning time intervals which are associated with the component supply devices 241A, 241B, 241C, 241D, and 241E. When the "collective refilling" is not performed at the identical refill timing TH set for the first component supply device 241A, and the second component supply devices 241B and 241C, the operator can perform new reel refilling operation at the residual component number warning time interval specified by the fifth specifying unit 3445 as a guide.

Figure 13:
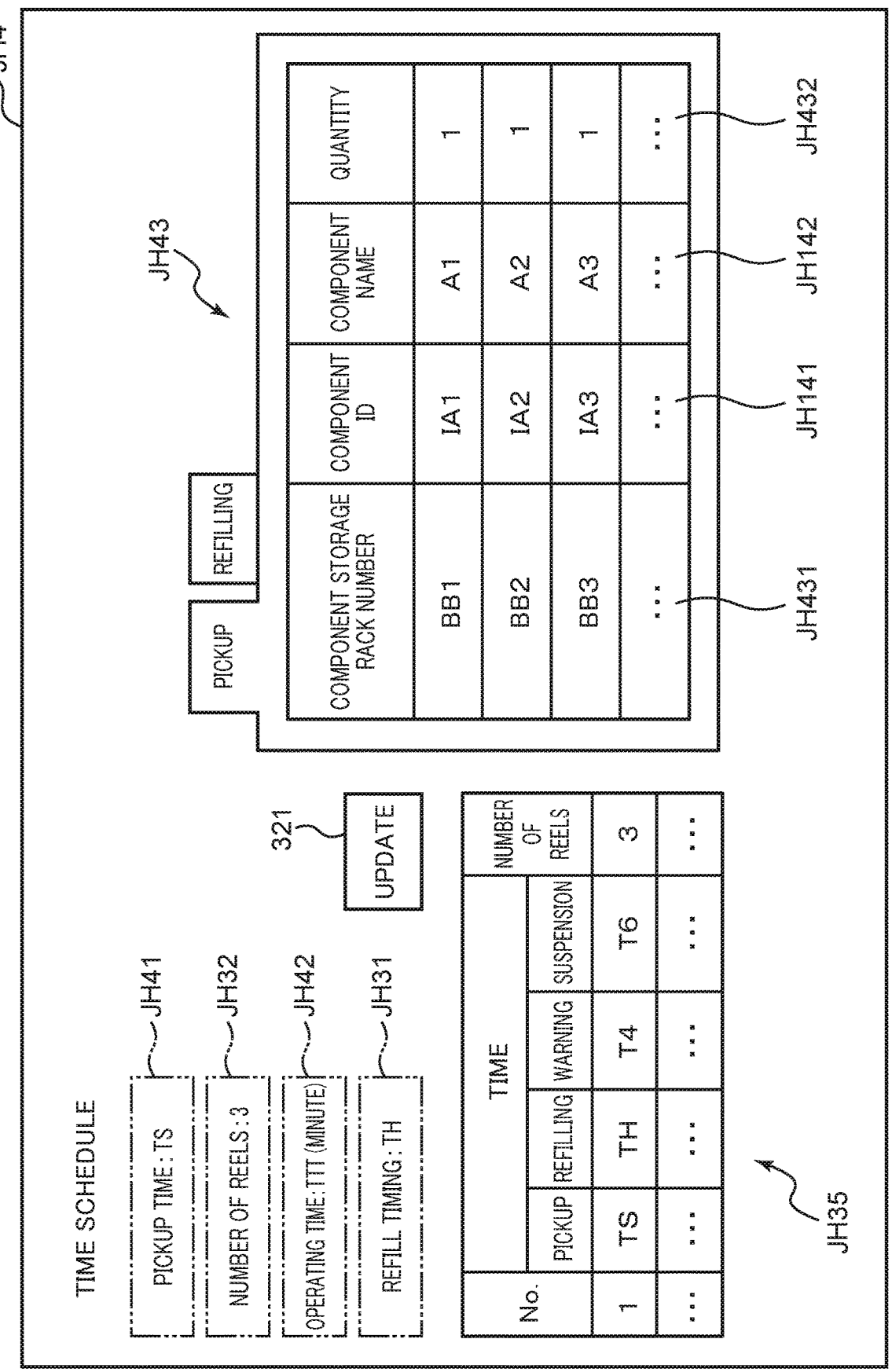
FIG. 13 is a diagram describing pickup specified result information generated by a pickup specifying unit in the component refill management system.

The pickup specifying unit 345 in the control unit 34 of the component refill management system 3 specifies pickup timing representing a time at which new reels, with which the first component supply device 241A and the second component supply devices 241B and 241C are refilled at the refill timing TH specified by the refill specifying unit 344, are to be picked up in the component storage unit 20 installed near the mounting machine 2. The pickup specifying unit 345 specifies, as illustrated in FIG. 11, a time which is earlier than the refill timing TH specified by the refill specifying unit 344 by a predetermined time as the pickup timing TS taking a time necessary for a component storage operator to perform the pickup operation (a pickup operation time period) into consideration. The pickup specifying unit 345 generates pickup specified result information representing a specified result. FIG. 13 is a diagram describing pickup specified result information JH4 generated by the pickup specifying unit 345 of the component refill management system 3.

The pickup specified result information JH4 generated by the pickup specifying unit 345 is information including pickup timing information JH41, the refill number information JH32, pickup operation time information JH42, the refill timing information JH31, the specified result association information JH35 in which the information JH41, JH32, JH42, JH31 are associated with one another, and pickup component information JH43.

The pickup timing information JH41 included in the pickup specified result information JH4 is information representing a specified result of the pickup timing TS at which a new reel is to be picked up in the component storage unit 20, the specified result being obtained by the pickup specifying unit 345. The pickup operation time information JH42 included in the pickup specified result information JH4 is information representing a pickup operation time period necessary for the pickup operation performed by the component storage operator.

The pickup component information JH43 included in the pickup specified result information JH4 is information relating to a new reel to be picked up in the component storage unit 20 at the pickup timing TS specified by the pickup specifying unit 345. The pickup component information JH43 is, as illustrated in FIG. 13, information in which component stock information JH431, the component identification information JH141, the component type specifying information JH142, and pickup number information JH432 are associated with one another. The component stock information JH431 is information for specifying a position in the component storage which houses a new reel to be picked up in the component storage unit 20. The pickup number information JH432 is information representing a number of new reels which are to be picked up in the component storage unit 20 so that the first component supply device 241A and the second component supply devices 241B and 241C are refilled with the new reels.

The pickup specified result information JH4 generated by the pickup specifying unit 345 is displayed on the display unit 33 controlled by the display control unit 343. As illustrated in FIG. 13, the update operation area 321, which partially forms the operation unit 32 that accepts an operation on the component refill management system 3 from an operator, is set on the display screen of the display unit 33, the pickup specified result information JH4 being displayed on the display screen. The operation on the update operation area 321 by the operator updates the specified result obtained by the pickup specifying unit 345.

The pickup specified result information JH4 generated by the pickup specifying unit 345 is transmitted to the information output unit 312 of the data communication unit 31, is controlled by the communication control unit 341, and is transmitted from the information output unit 312 to the component unloading management device 7. The component storage operator unloads reels or the like from the component storage and houses the reels in the component storage unit 20 installed near the mounting machine 2 based on the pickup specified result information JH4, which is transmitted from the information output unit 312 and is input into the component unloading management device 7, so that the reels or the like are picked up in the component storage unit 20.

The refilling efficiency improvement specifying unit 346 in the control unit 34 of the component refill management system 3 specifies an efficiency improvement condition for improving a new reel refilling efficiency. The refilling efficiency improvement specifying unit 346 includes, as illustrated in FIG. 8, target component specifying unit 3461 and disposing specifying unit 3462.

In the refilling efficiency improvement specifying unit 346, the target component specifying unit 3461 recognizes the components E, which are mounted most frequently per unit time, as the target components, based on the cycle time information JH144 included in the production plan information JH1 input from the production plan management device 5 via the information acquisition unit 311 of the data communication unit 31. The target component specifying unit 3461 specifies the efficiency improvement condition such that to lengthen the new reel refilling cycle, a number of the housed target components in the reel is increased to a predetermine value. The efficiency improvement condition specified by the target component specifying unit 3461 is referred to as "first efficiency improvement condition". An example of the first efficiency improvement condition specified by the target component specifying unit 3461 includes a condition such that the number of the component supply devices 241, which is to be mounted with the reels, around which the component housing tapes 243 housing the target components are wound, and is disposed in parallel on the carriage 242 in the component supply unit 24, is increased (for example, doubled) or a condition such that the component housing tapes 243 housing the target components are lengthened and thus the number of housed target components is increased.

The refilling efficiency improvement specifying unit 346 generates first refilling efficiency improvement information relating to the first efficiency improvement condition specified by the target component specifying unit 3461. FIG. 14 is a diagram describing first refilling efficiency improvement information JH5 generated by the refilling efficiency improvement specifying unit 346 of the component refill management system 3.

The first refilling efficiency improvement information JH5, which is generated by the refilling efficiency improvement specifying unit 346 based on the specified result in the target component specifying unit 3461, is information in which the board information JH11, the component identification information JH141, and the component type specifying information JH142, component supply device specifying information JH51, refilling cycle information JH52, and refilling frequency information JH53 are associated with one another before and after the improvement in the refilling efficiency. In an example illustrated in FIG. 14, a "component A1", a "component A2", and a component A3", which are identified by "IA1", "IA2", and "IA3" represented by the component identification information JH141 and are represented by the component type specifying information JH142, are mounted on a "board A" represented by the board information JH11 so that a mounting board is produced. The target component specifying unit 3461 recognizes the "component A1" as the target component, and specifies the first efficiency improvement condition such that a number of the component supply devices 241 mounted with reels around which the component housing tapes 243 housing the "components A1" are wound is doubled.

In the first refilling efficiency improvement information JH5, the component supply device specifying information JH51 is information for specifying the component supply devices 241 mounted with reels around which the component housing tapes 243 housing the "component A1", the "component A2" and the "component A3" are wound. In the example illustrated in FIG. 14, before improvement in the refilling efficiency by the target component specifying unit 3461, "one" component supply device 241 represented by feeder identification information "IFA1" is disposed to be associated with the "component A1" as the target component. On the other hand, after the improvement in the refilling efficiency by the target component specifying unit 3461, "two" component supply devices 241 represented by feeder identification information "IFA1-1" and "IFA1-2" are disposed to be associated with the "component A1" as the target component.

In the first refilling efficiency improvement information JH5, the refilling cycle information JH52 is information representing a refilling cycle before and after "collective refilling" for collectively performing the reel refilling operation on the component supply devices 241 at the refilling time of new reels to be attached to the component supply devices 241 that supply the "component A1", the "component A2", and the "component A3", respectively. A refilling cycle "TT2" for the "collective refilling" after the improvement in the refilling efficiency by the target component specifying unit 3461 is extended longer than a refilling cycle "TT1" in the "collective refilling" before the improvement in the refilling efficiency by the target component specifying unit 3461.

In the first refilling efficiency improvement information JH5, the refilling frequency information JH53 is information representing the refilling frequency in one hour in the case of the "collective refilling" of the reels for the component supply devices 241. The refilling frequency "TT1" in the case of the "collective refilling" after the improvement in the refilling efficiency by the target component specifying unit 3461 is lower than refilling frequency "TT" in the case of the "collective refilling" before the improvement in the refilling efficiency by the target component specifying unit 3461.

The first refilling efficiency improvement information JH5 generated by the refilling efficiency improvement specifying unit 346 is displayed on the display unit 33 controlled by the display control unit 343. The first refilling efficiency improvement information JH5 generated by the refilling efficiency improvement specifying unit 346 is transmitted to the information output unit 312 of the data communication unit 31, is controlled by the communication control unit 341, and transmitted from the information output unit 312 to the component refilling efficiency improvement management device 8. The operator can plan a countermeasure for improving the refilling efficiency of the reels in the component supply devices 241 based on the first refilling efficiency improvement information JH5 which is transmitted from the information output unit 312 and is input into the component refilling efficiency improvement management device 8.

As described above, the target component specifying unit 3461 of the refilling efficiency improvement specifying unit 346 recognizes a component, which is mounted most frequently per unit time, as the target component. The target component specifying unit 3461 specifies the first efficiency improvement condition, for improving the reel refilling efficiency, such that the number of target components to be housed in the reel is increased. This specification can lengthen the refilling cycle of the reel which houses the target components. The frequency with which the operator moves to the mounting machine 2 mounted with the component supply devices 241 can be further reduced, and thus the burden of the refilling operation on the operator can be further reduced.

In the refilling efficiency improvement specifying unit 346, the disposing specifying unit 3462 specifies, as the efficiency improvement condition, a disposing position of the component supply device 241 which is the ALF in the component supply units 24 in the plurality of mounting machines 2 installed in parallel in the mounting line of the component mounting system 1. The efficiency improvement condition specified by the disposing specifying unit 3462 is referred to as a "second efficiency improvement condition". The refilling efficiency improvement specifying unit 346 generates second refilling efficiency improvement information relating to the second efficiency improvement condition specified by the disposing specifying unit 3462. FIG. 15 is a diagram describing second refilling efficiency improvement information JH6 generated by the refilling efficiency improvement specifying unit 346 of the component refill management system 3.

The second refilling efficiency improvement information JH6, which is generated by the refilling efficiency improvement specifying unit 346 based on the specified result obtained by the disposing specifying unit 3462, is information representing the disposing position of the component supply device 241 which is the ALF before and after the improvement in the refilling efficiency. In an example illustrated in FIG. 15, the plurality of mounting machines 2 installed in parallel in the mounting line of the component mounting system 1 include the mounting machine 2A, the mounting machine 2B, the mounting machine 2C, and the mounting machine 2D disposed in this order from a far side to a near side with respect to the component storage unit 20. In the four component supply units 24 in the mounting machines 2A, 2B, 2C, and 2D, respectively, the component supply units 24 in which the component supply devices 241 which are the ALFs are disposed are described as "ALF".

As described above, as the tape feeders disposed in the component supply units 24 of the mounting machines 2, respectively, both splicing feeders and the component supply devices 241 which are ALFs may be disposed. In the splicing feeders, however, a splicing operation using a splicing tape or the like is performed just when the component housing tape is completely fed from one reel, and thus the refill timing for a reel around which a subsequent component housing tape is wound is limited to the time when the feeing of the precedent component housing tape is completely fed. Therefore, in the splicing feeders, the new reel refilling timings needs to be specified individually, and thus unlike the case of the component supply devices 241 which are the ALFs, the identical refilling timing cannot be set in order to perform the "collective refilling" for the reels on the plurality of component supply devices 241.

Thus, the disposing specifying unit 3462 specifies the second efficiency improvement condition such that the component supply devices 241 as ALFs that can perform the "collective refilling" of the reels are collectively disposed in the component supply unit 24 in the mounting machine 2D on a near side of the component storage unit 20. When the component supply devices 241 which are ALFs are collectively disposed in the component supply unit 24 in the mounting machine 2D on the near side of the component storage unit 20, a moving distance by which the operator for the refilling operation moves can be shortened in the case of the "collective refilling" of the reels in the plurality of component supply devices 241. The refilling efficiency improvement specifying unit 346 generates the second refilling efficiency improvement information JH6 illustrated in FIG. 15 relating to the second efficiency improvement condition specified by the disposing specifying unit 3462.

The second refilling efficiency improvement information JH6 generated by the refilling efficiency improvement specifying unit 346 is displayed on the display unit 33 controlled by the display control unit 343. The second refilling efficiency improvement information JH6 generated by the refilling efficiency improvement specifying unit 346 is transmitted to the information output unit 312 of the data communication unit 31, is controlled by the communication control unit 341, and is transmitted from the information output unit 312 to the component refilling efficiency improvement management device 8. The operator can plan a countermeasure relating to the disposing positions of the component supply devices 241 in order to improve the reel refilling efficiency for the component supply devices 241, based on the second refilling efficiency improvement information JH6 which is transmitted from the information output unit 312 and is input into the component refilling efficiency improvement management device 8.

In the component mounting system 1 according to the present embodiment which includes the component refill management system 3 that can reduce the burden of the refilling operation on the operator, a delay in the refilling operation to be performed by the operator is reduced, and thus suspension of supply of components from the component supply device 241 can be reduced as far as possible during the production of a mounting board. This configuration can prevent a decrease in production efficiency of a mounting board.

The above has described the component refill management system and the component mounting system according to the embodiment of the present disclosure, but the present disclosure is not limited to the above embodiment and thus may include, for example, the following modifications.

The above embodiment has described the component supply device 241, which includes the tape feeder to which the reel 2420 around which the component housing tape 243 is wound is attachable, as the component supply device installed in the mounting machine 2, but the present disclosure is not limited to such a configuration. The component supply device may be a device to which a plurality of component housing members housing components are attachable, may be, for example, a tray feeder to which a plurality of palettes including trays where components are placed are attachable, or a stick feeder to which a plurality of sticks housing components are attachable.

<First Modification>

Figure 16:
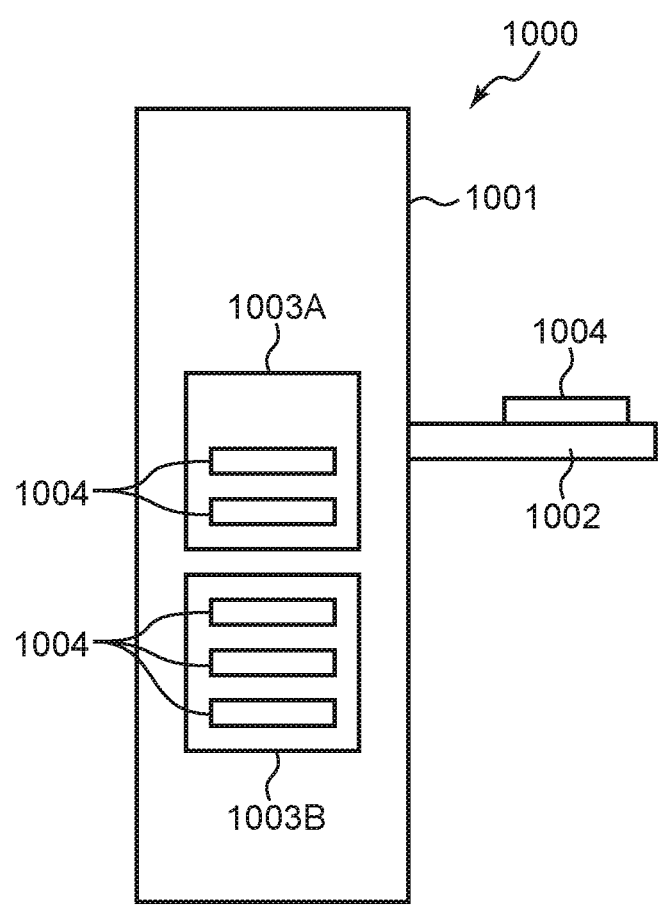
FIG. 16 is a diagram illustrating a tray feeder which is the component supply device according to a first modification.
Figure 17:
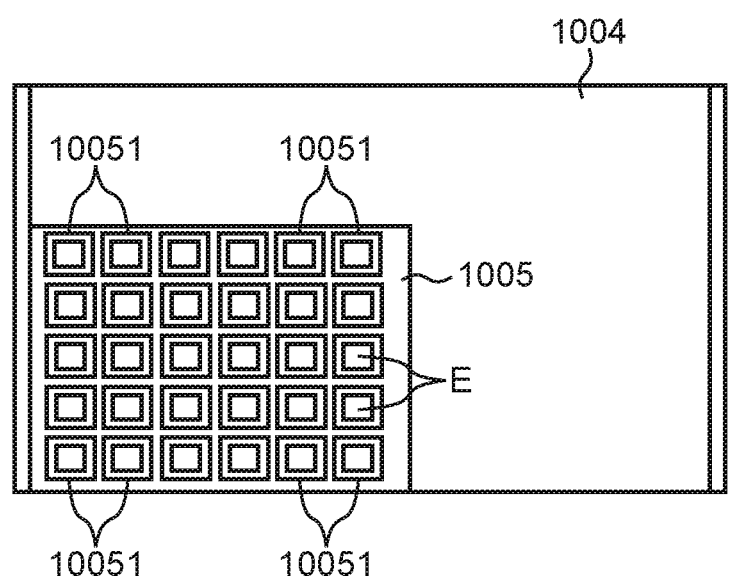
FIG. 17 is a diagram illustrating a pallet to be attached to the tray feeder of FIG. 16.

FIG. 16 is a diagram illustrating a tray feeder 1000 which is the component supply device according to the first modification. FIG. 17 is a diagram illustrating a pallet 1004 to be attached to the tray feeder 1000 of FIG. 16.

The tray feeder 1000 is disposed in a component supply unit 24 of a mounting machine 2. The plurality of tray feeders 1000 can be disposed in parallel in the component supply unit 24. The tray feeder 1000 is configured to be capable of supplying components E with the components E being held on a palette 1004. At least one tray 1005 that holds the plurality of components E is placed on the palette 1004. The tray 1005 has a rectangular shape in a plan view, and includes a plurality of component housing units 10051 arranged into a matrix pattern thereon. The components E are housed in the component housing units 10051, respectively, at equal intervals. The plurality of palettes 1004 having such configuration are housed in a first magazine 1003A and a second magazine 1003B.

The first magazine 1003A and the second magazine 1003B each have a function of a component housing member that houses the plurality of palettes 1004 on which the tray 1005 holding the components E is placed. The first magazine 1003A and the second magazine 1003B are vertically movable independently in the cover body 1001. The palettes 1004 housed in the first magazine 1003A and the second magazine 1003B are moved to a table 1002, which protrudes outward from the cover body 1001, during the production of a mounting board, and this movement supplies the components E with the components E being held on the palettes 1004.

During the production of a mounting board, even if no component E is present on the palette 1004 housed in the first magazine 1003A, the palette 1004 housed in the second magazine 1003B is moved to the table 1002, and thus the components E, which are held on the palette 1004, are supplied. At this time, an operator takes the first magazine 1003A containing no component out of the cover body 1001 during the production of a mounting board, and can refill the tray feeder 1000 with a new magazine. A refill timing for the new magazine is not limited to a time when the first magazine 1003A has no component, and thus is specified by a refill specifying unit 344 of a component refill management system 3.

The refill specifying unit 344 does not individually specify the refill timings for new magazines in the plurality of tray feeders 1000 disposed in parallel in a component supply unit 24. In the refill specifying unit 344, a first specifying unit 3441 specifies refillable time intervals representing new magazine refillable time intervals between a first time at which the palette 1004 housed in the first magazine 1003A has no component E and a second time at which a sum of residual components reaches a residual component number warning value with the refillable time intervals being associated with the plurality of tray feeders 1000, respectively. Similar in the case of the component supply device 241 which is the tape feeder, a fourth specifying unit 3444 of the refill specifying unit 344 recognizes an overlapped time interval based on the refillable time intervals, and specifies a predetermined time within the overlapped time interval as a refill timing TH for a new magazine. The refill specifying unit 344 enables "collective refilling" such that the operator collectively performs the refilling operation for new magazines on the tray feeder 1000 which can be refilled with the new magazine at the identical refill timing TH. This can reduce the burden of the refilling operation on the operator.

<Second Modification>

Figure 18:
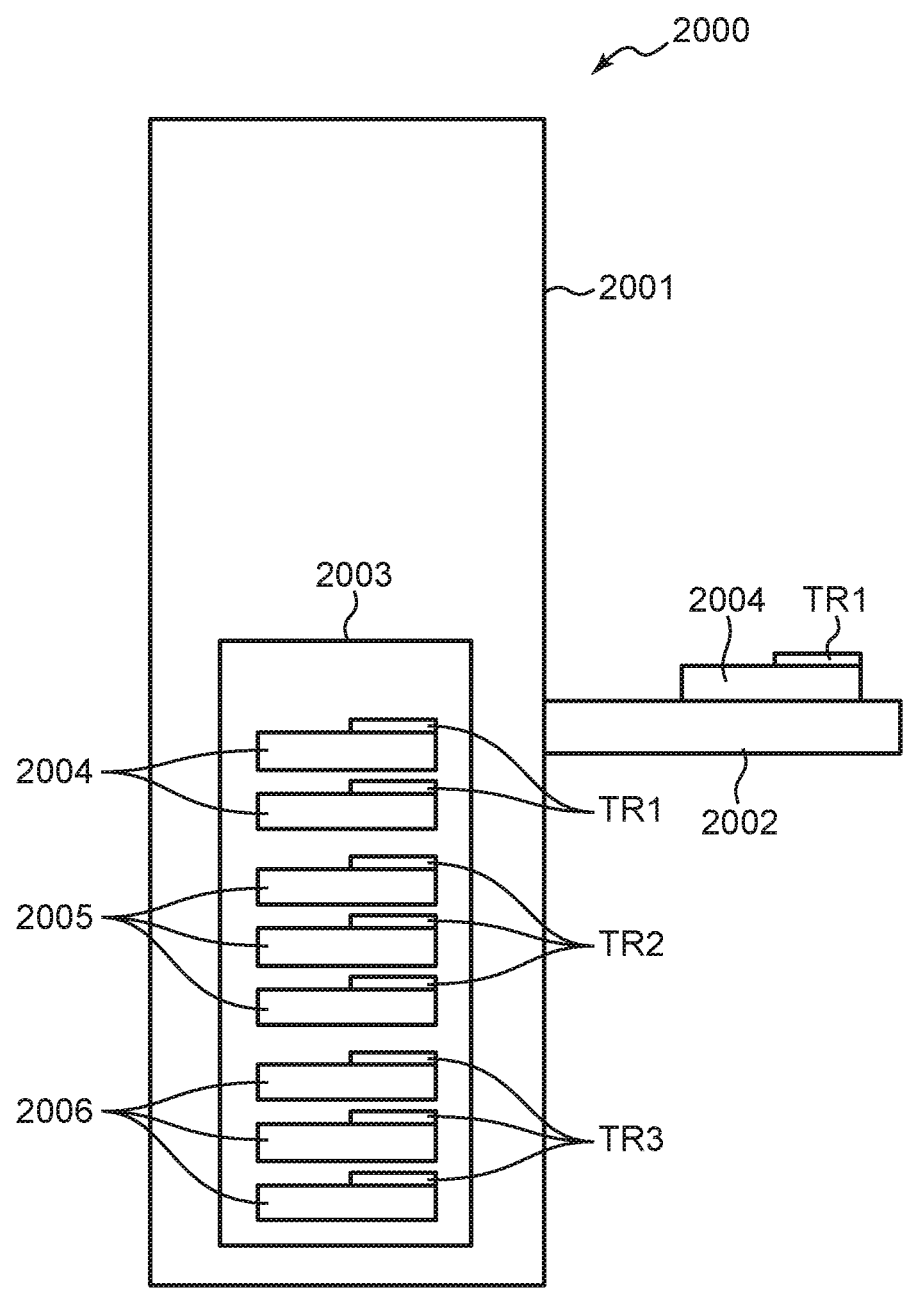
FIG. 18 is a diagram illustrating a tray feeder which is the component supply device according to a second modification.

FIG. 18 is a diagram illustrating a tray feeder 2000 which is a component supply device according to a second modification. The tray feeder 2000 is placed on a component supply unit 24 of a mounting machine 2. The plurality of tray feeders 2000 are disposed in parallel in the component supply unit 24. The tray feeders 2000 are configured so that one magazine 2003 is vertically movable in a cover body 2001. The magazine 2003 houses a plurality of first palettes 2004, a plurality of second palettes 2005, and a plurality of third palettes 2006.

At least one first tray TR1 holding a plurality of components is placed on each of the first palettes 2004. A type of the components held on the first tray TR1 is identical in the first palettes 2004. Similarly, at least one second tray TR2 holding a plurality of components is placed on each of the second palettes 2005. A type of the components held on the second tray TR2 is identical in the second palettes 2005. The type of the components held on the second tray TR2 is different from the type of the components held on the first tray TR1. At least one third tray TR3 holding a plurality of components is placed on each of the third palettes 2006. A type of the components held on the third tray TR3 is identical in the third palettes 2006. The type of the components held on the third tray TR3 is different from the types of the components held on the first tray TR1 and the second tray TR2.

The first palette 2004, the second palette 2005, and the third palette 2006 each have a function of a component housing member on which the trays TR1, TR2, and TR3 holding the plurality of components are placed. The first palette 2004, the second palette 2005, and the third palette 2006 housed in the magazine 2003 are moved to a table 2002, which protrudes outward from a cover body 2001, during the production of a mounting board, and thus the components which are held on the trays TR1, TR2, and TR3 are supplied.

During the production of a mounting board, even if the first tray TR1 placed on one of the plurality of first palettes 2004 has no component, another first palette 2004 is moved to the table 2002, and thus the components which are held on the first tray TR1 are supplied. At this time, during the production of a mounting board, an operator can take the first palette 2004 with no component out of the cover body 2001 and can refill the tray feeder 2000 with a new first palette. Similarly, during the production of a mounting board, even if the second tray TR2 placed on one of the plurality of second palettes 2005 has no component, another second palette 2005 is moved to the table 2002, and thus the components which are held on the second tray TR2 are supplied. At this time, during the production of a mounting board, the operator can take the second palette 2005 having no component out of the cover body 2001, and can refill the tray feeder 2000 with a new second palette. During the production of a mounting board, even if the third tray TR3 placed on one of the plurality of third palettes 2006 has no component, another third palette 2006 is moved to the table 2002, and thus the components which are held on the third tray TR3 are supplied. At this time, during the production of a mounting board, the operator can take the third palette 2006 having no component out of the cover body 2001, and can refill the tray feeder 2000 with a new third palette.

In the tray feeder 2000, a number of palettes varies among the first palettes 2004, the second palettes 2005, and the third palettes 2006 in some cases. In this case, a number of new palettes for refilling which are filled with identical components varies among the first palettes, the second palettes, and the third palettes. The number of new palettes for refilling might vary depending on a sum of residual components whose type corresponds to the new palette.

The refill timings of the new first, second, and third palettes are not limited to the time when each of the trays has no component, but is specified by a refill specifying unit 344 of a component refill management system 3.

The refill specifying unit 344 does not individually specify the refill timings for new first, second, and third palettes in the tray feeder 2000. In the refill specifying unit 344, the first specifying unit 3441 specifies a refillable time interval representing a time interval between a first time and a second time during which a new first palette is refillable. At the first time, the first tray TR1 placed on one of the plurality of first palettes 2004 has no component. At the second time, a sum of residual components reaches a residual component number warning value. Similarly, the first specifying unit 3441 specifies a refillable time interval representing a time interval between a first time and a second time during which a new second palette is refillable. At the first time, the second tray TR2 placed on one of the plurality of second palettes 2005 has no component. At the second time, a sum of residual components reaches a residual component number warning value. The first specifying unit 3441 further specifies a refillable time interval representing a time interval between a first time and a second time during which a new third palette is refillable. At the first time, the third tray TR3 placed on one of the plurality of third palettes 2006 has no component. At the second time, a sum of residual components reaches a residual component number warning value. Similarly in the case of the component supply device 241 which is the tape feeder, a fourth specifying unit 3444 of the refill specifying unit 344 recognizes an overlapped time interval based on the refillable time intervals, and specifies predetermined times within the overlapped time interval as refill timings TH of the new first, second, and third palettes in the tray feeder 2000. This specification enables "collective refilling" in which the operator collectively performs the refilling operation for the new first, second, and third palettes, thus reducing a burden of the refilling operation on the operator.

<Third Modification>

Figure 19:
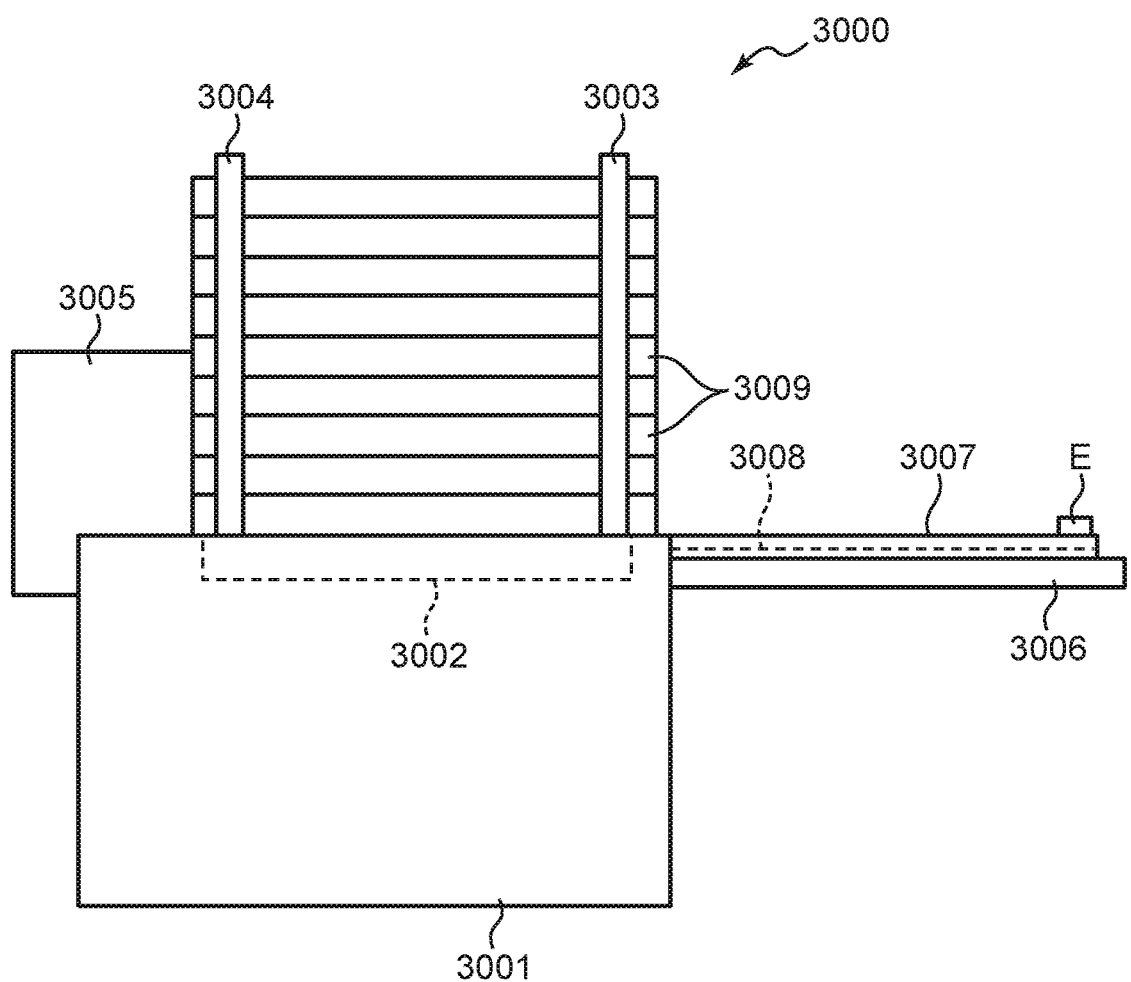
FIG. 19 is a diagram illustrating a stick feeder which is the component supply device according to a third modification.

FIG. 19 is a diagram illustrating a stick feeder 3000 which is a component supply device according to a third modification. The stick feeder 3000 is disposed in a component supply unit 24 of a mounting machine 2. The plurality of stick feeders 3000 are disposed in parallel in the component supply unit 24. The stick feeder 3000 is configured so that components E housed in sticks 3009 as cylindrical component housing members are extruded from the sticks 3009 to be supplied. The stick feeder 3000 includes a frame main body 3001, a stick table 3002 disposed on an upper portion of the frame main body 3001, a first chuck 3003, a second chuck 3004, a component extrusion mechanism unit 3005, a guide frame 3006, a pair of guide rails 3007, and a conveyance belt 3008.

The frame main body 3001 has a hollow box shape having an opening at its top. The stick table 3002 is disposed on the inside of an upper portion of the frame main body 3001. The plurality of sticks 3009 can be placed on the stick table 3002 in a laminated state. The first chuck 3003 can simultaneously hold front ends of the sticks 3009 other than the lowest stick 3009 in the plurality of sticks 3009 on the stick table 3002. Similarly, the second chuck 3004 can simultaneously hold rear ends of the sticks 3009 other than the lowest stick 3009 in the plurality of sticks 3009 on the stick table 3002.

The component extrusion mechanism unit 3005 extrudes a component E forward from the lowest stick 3009 in the plurality of sticks 3009 on the stick table 3002. The guide frame 3006 is fixed to a front portion of the frame main body 3001, and the pair of guide rails 3007 is supported to the guide frame 3006. The conveyance belt 3008 is disposed between the pair of guide rails 3007. The component E extruded forward by the component extrusion mechanism unit 3005 is conveyed by the conveyance belt 3008 along the pair of guide rails 3007. Thus, the component E housed in the stick 3009 is supplied to a component supply position.

When the lowest stick 3009 has no component in response to a component supply operation, the first and second chucks 3003 and 3004 hold the sticks 3009 other than the lowest stick 3009. In this state, the stick table 3002 is shifted to a supporting release position where the supporting of the sticks 3009 is released, and thus only the lowest stick 3009 is caused to drop into an inner bottom portion of the frame main body 3001 through its self weight. After disposal of the stick 3009 with no component, the stick table 3002 returns to the supporting position of the stick 3009, and release of the first and second chucks 3003 and 3004 places the residual sticks 3009 on the stick table 3002, thus supplying a component E from a next (lowest) stick 3009.

During the production of a mounting board, the stick 3009 with no component drops into the inner bottom portion of the frame main body 3001, the operator can refill the stick feeder 3000 with a new stick.

A number of the sticks 3009 housing the identical type of the components E occasionally varies in the plurality of stick feeders 3000. In this case, a number of new sticks which are refilled with identical components varies in the stick feeders 3000. The number of new sticks for refilling might varies depending on the sum of residual components whose type corresponds to the new stick.

A refill timing for a new stick is not limited to a time when the lowest stick 3009 has no component, but is specified by a refill specifying unit 344 of a component refill management system 3.

The refill specifying unit 344 does not individually specify the refill timings for new sticks in the plurality of stick feeders 3000 disposed in parallel in the component supply unit 24. In the refill specifying unit 344, a first specifying unit 3441 specifies refillable time intervals representing time intervals between a first time and a second time during which a new stick is refillable with the refillable time intervals being associated with the plurality of stick feeders 3000, respectively. At the first time, the lowest stick 3009 has no component E. At the second time, a sum of residual components reaches a residual component number warning value. Similarly in the case of the component supply device 241 which is the tape feeder, a fourth specifying unit 3444 of the refill specifying unit 344 recognizes an overlapped time interval based on the refillable time intervals, and specifies a predetermined time within the overlapped time interval as a refill timing TH for new sticks. The refill specifying unit 344 enables "collective refilling" such that the operator collectively performs a refilling operation for new sticks on the stick feeders 3000 which can be refilled with new sticks at the identical refill timing TH. This can reduce the burden of the refilling operation on the operator.

<Fourth Modification>

Figure 20:
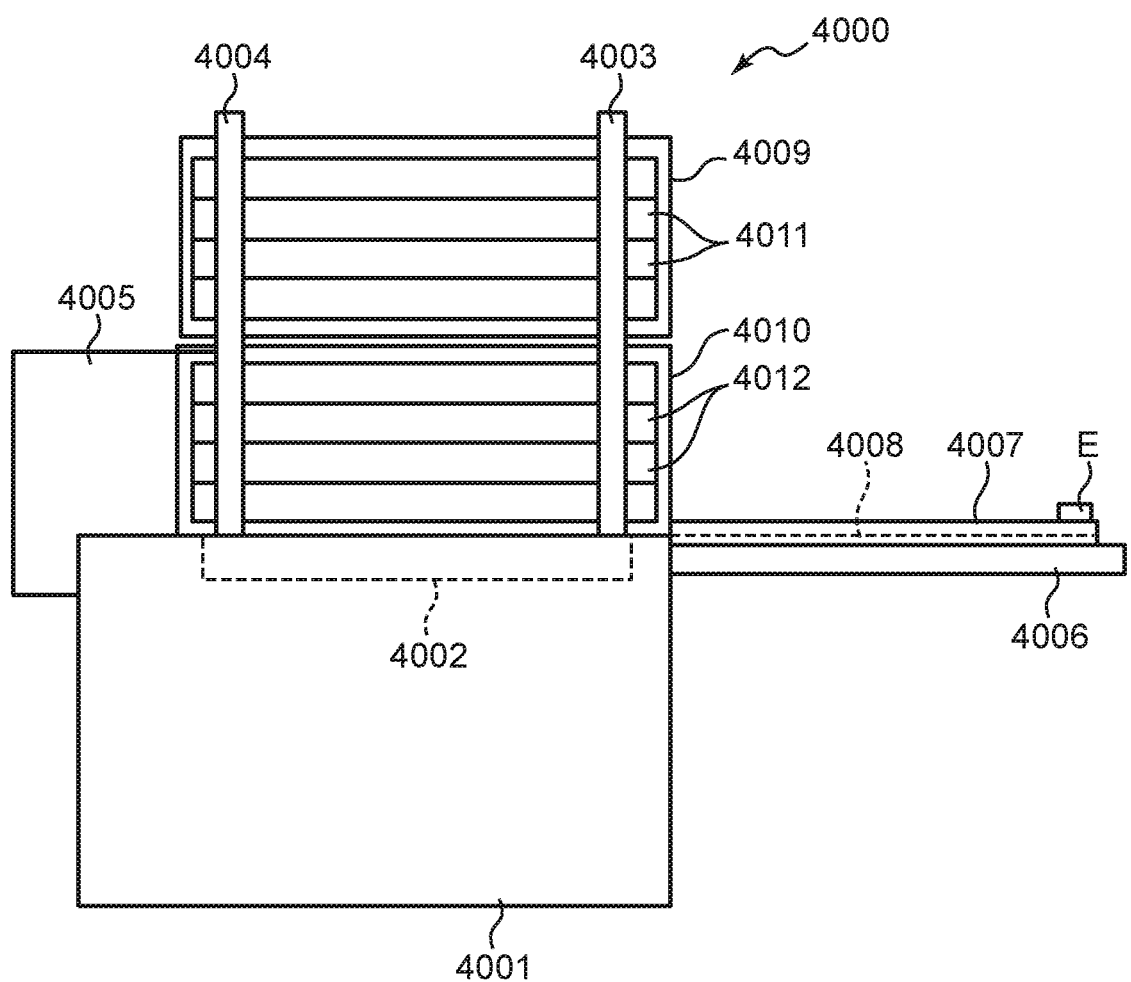
FIG. 20 is a diagram illustrating a stick feeder which is the component supply device according to a fourth modification.

FIG. 20 is a diagram illustrating a stick feeder 4000 which is a component supply device according to a fourth modification. The stick feeder 4000 is disposed in a component supply unit 24 of a mounting machine 2. The plurality of stick feeders 4000 are disposed in parallel in the component supply unit 24.

The stick feeder 4000 has a basic configuration similar to the stick feeder 3000. The stick feeder 4000 includes a first magazine 4009 that houses a plurality of sticks 4011 housing components E in a stacked state, and a second magazine 4010 that houses a plurality of sticks 4012 housing components E in a stacked state. A type of the components E housed in the sticks 4011 is identical to a type of the components E housed in the sticks 4012. The first magazine 4009 and the second magazine 4010 each have a function of a component housing member that houses a plurality of sticks 4011 and 4012 that house the components E. In an example illustrated in FIG. 20, the sticks 4012 housed in the second magazine 4010 are placed in a stacked state on the stick table 4002 disposed on the inside of an upper portion of the frame main body 4001, and the sticks 4011 housed in the first magazine 4009 are disposed above the sticks 4012 in a stacked state.

In the stick feeder 4000, a component extrusion mechanism unit 4005 extrudes the components E forward from the lowest stick 4012 in the plurality of sticks 4012 housed in the second magazine 4010 disposed on a lower portion on the stick table 4002. The components E extruded forward by the component extrusion mechanism unit 4005 are conveyed by a conveyance belt 4008 along a pair of guide rails 4007 supported to a guide frame 4006. This causes the components E housed in the stick 4012 to be supplied to the component supply device.

When the lowest stick 4012 has no component in response to the component supply operation, the first and second chucks 4003 and 4004 hold the sticks 4012 other than the lowest stick in the second magazine 4010 and all the sticks 4011 in the first magazine 4009. In this state, the stick table 4002 is shifted to a supporting release position where the supporting of the sticks 4011 and 4012 is released, and thus only the lowest stick 4012 in the second magazine 4010 is caused to drop into an inner bottom portion of the frame main body 4001 by its self weight. After disposal of the stick 4012 with no component, the stick table 4002 returns to supporting positions of the sticks 4011 and 4012, and when the first and second chucks 4003 and 4004 are released, residual sticks 4011 and 4012 are placed on the stick table 4002, thus supplying the components E from a next (lowest) stick 4012 in the second magazine 4010.

During the production of a mounting board, when all the sticks 4012 in the second magazine 4010 have no component, the components E are supplied from the stick 4011 in the first magazine 4009. When all the sticks 4012 in the second magazine 4010 have no component, an operator can refill the stick feeder 4000 with a new magazine. A refill timing for a new magazine is not limited to a time when all the sticks 4012 in the second magazine 4010 have no component, but is specified by a refill specifying unit 344 of a component refill management system 3.

The refill specifying unit 344 does not individually specify the refill timings for new sticks in the plurality of stick feeders 4000 disposed in parallel in the component supply unit 24. In a refill specifying unit 344, a first specifying unit 3441 specifies refillable time intervals representing time intervals between a first time and a second time during which new magazines are refillable with the refillable time intervals being associated with the plurality of stick feeders 4000, respectively. At the first time, all the sticks 4012 in the second magazine 4010 have no component. At the second time, a sum of residual components reaches a residual component number warning value. Similar in the case of the component supply device 241 which is the tape feeder, a fourth specifying unit 3444 of the refill specifying unit 344 recognizes an overlapped time interval based on the refillable time intervals, and specifies a predetermined time within the overlapped time interval as a refill timing TH for a new magazine. The refill specifying unit 344 enables "collective refilling" such that an operator collectively performs an refilling operation for new sticks on the stick feeders 4000 which can be refilled with new magazines at the identical refill timing TH. This can reduce the burden of the refilling operation on the operator.

<Fifth Modification>

Figure 21:
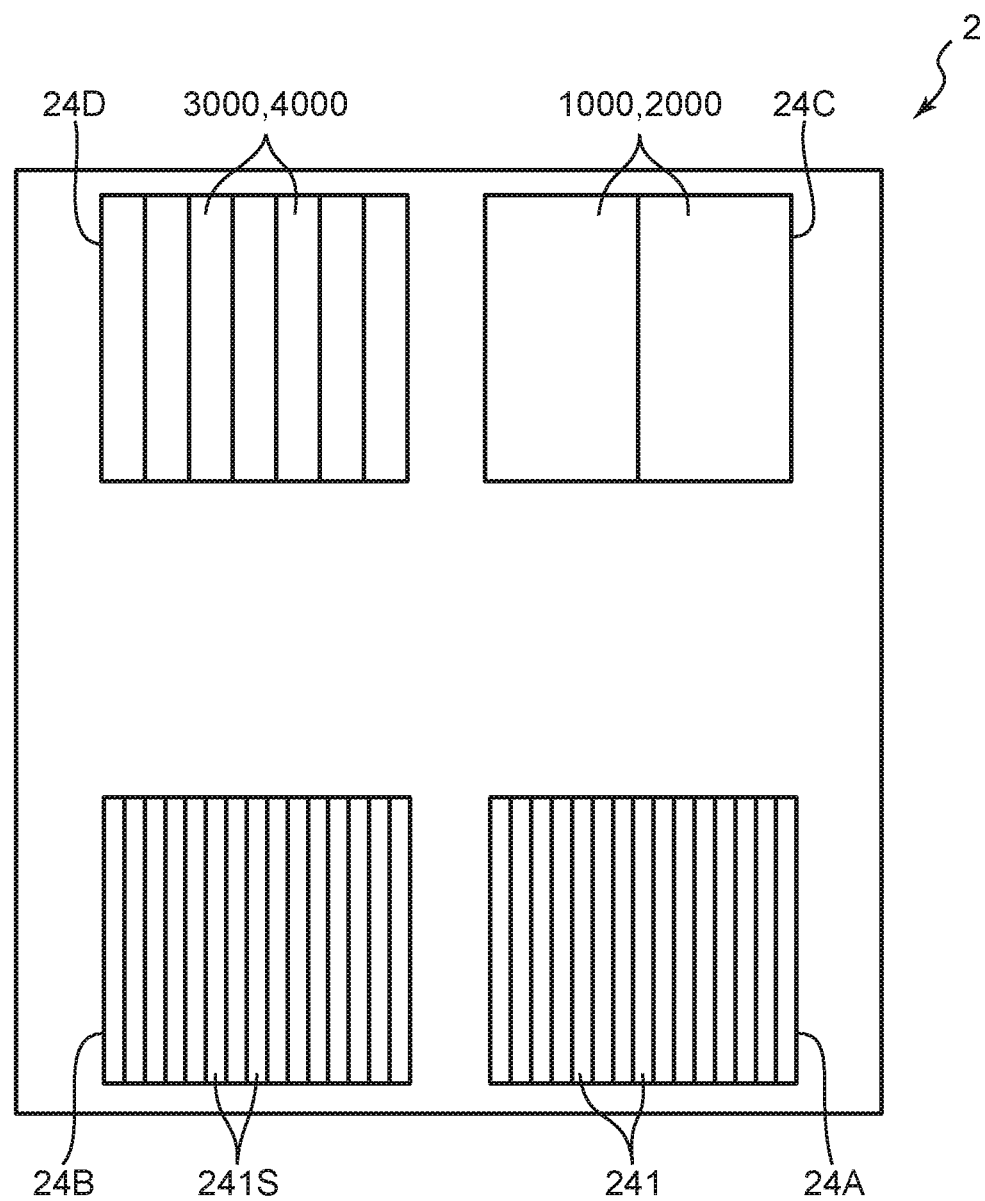
FIG. 21 is a plan view schematically illustrating a configuration of a mounting machine according to a fifth modification.

FIG. 21 is a plan view schematically illustrating a configuration of a mounting machine 2 according to a fifth modification. FIG. 22 is a diagram describing refill specified result information JH3A generated by a refill specifying unit 344 in a component refill management system 3 of a component mounting system 1 having a mounting machine 2 according to the fifth modification. FIG. 23 is a diagram describing pickup specified result information JH4A generated by a pickup specifying unit 345 in accordance with the refill specified result information JH3A.

Two or more types of component supply devices employing different component supply methods may be disposed in each of component supply units 24 of the mounting machine 2. In an example illustrated in FIG. 21, in the four component supply units 24 of the mounting machine 2, a plurality of component supply devices 241 which is an automatic loading feeder (ALF) (hereinafter, the "ALF 241") are disposed in parallel in a component supply unit 24A; a plurality of splicing feeders 241S are disposed in parallel in the component supply unit 24B; a plurality of tray feeders 1000 and 2000 are disposed in parallel in the component supply unit 24C; and a plurality of stick feeders 3000 and 4000 are disposed in parallel in the component supply unit 24D.

As described above, the ALF 241, the tray feeders 1000 and 2000, and the stick feeders 3000 and 4000 are component supply devices to which the plurality of component housing members housing components are attachable and in which refill timing for a new component housing member is not limited to a time when a precedent component housing member has no component. On the other hand, the splicing feeder 241S which is configured so that one reel is attached thereto. Before a component housing tape is completely fed from that reel and has no component, to achieve a shift from that component housing tape to a subsequent component housing tape, a splicing tape or the like is applied between a rear end of the precedent component housing tape and a front end of the subsequent component housing tape so that both the tapes are connected to each other. That is, in the splicing feeder 241S, a splicing operation using a splicing tape or the like is performed before the component housing tape is completely fed from one reel and has no component. This splicing operation limits a refill timing for a reel around which a subsequent component housing tape is wound to a time when a precedent component housing tape is completely fed.

As described above, in a case where the component supply devices employing different component supply methods are disposed in the component supply units 24 of the mounting machine 2, the refill specifying unit 344 of the component refill management system 3 does not individually specify refill timings for new component housing members in the ALF 241, the tray feeders 1000 and 2000, and the stick feeders 3000 and 4000. A first specifying unit 3441 of the refill specifying unit 344 specifies refillable time intervals representing time intervals between a first time and a second time during which new component housing members are refillable in the ALFs 241, the tray feeders 1000 and 2000, and the stick feeders 3000 and 4000. At the first time, the precedent component housing member has no component. At the second time, a sum of residual components reaches a residual component number warning value. The fourth specifying unit 3444 of the refill specifying unit 344 specifies an overlapped time interval based on the refillable time intervals, and specifies a predetermined time within the overlapped time interval as a refill timing TH for new component housing members. The refill specifying unit 344 enables "collective refilling" such that an operator collectively performs a refilling operation for new component housing members in the component supply devices which can be refilled with the new component housing members at the identical refill timing TH.

For example, it is assumed that in one mounting machine 2, the refill specifying unit 344 specifies the identical refill timing TH for one ALF 241 in the plurality of the ALFs 241 disposed in parallel in a component supply unit 24A, one tray feeder 1000 or 2000 in the plurality of tray feeders 1000 and 2000 disposed in parallel in the component supply unit 24C, one stick feeder 3000 or 4000 in the plurality of stick feeders 3000 and 4000 disposed in parallel in the component supply unit 24D. In this case, the refill specifying unit 344 further monitors a component supply condition of the plurality of splicing feeders 241S disposed in parallel in the component supply unit 24B. When the splicing feeder 241S in which a number of residual components is smaller than a predetermined value is present, the refill specifying unit 344 specifies also a refill timing for a new reel in this splicing feeder 241S as the refill timing TH. In such a case, the refill specified result information JH3A generated by the refill specifying unit 344 is illustrated in FIG. 22.

The refill specified result information JH3A is information including, for example, refill timing information J3A1 and refill component information J3A2. The refill timing information J3A1 is information representing a specified result of the refill timing TH. The refill component information J3A2 includes information relating to new component housing members with which the ALF 241, the tray feeders 1000 and 2000, and the stick feeders 3000 and 4000 are to be refilled at the refill timing TH, and information relating to a reel to be prepared for the splicing feeder 241S. The refill component information J3A2 is information in which mounting machine type specifying information J3A3, component supply unit position information J3A4, component supply device type specifying information J3A5, component supply device identification information J3A6, component identification information J3A7, and the component type specifying information J3A8 are associated with one another. The mounting machine type specifying information J3A3 is information for specifying the mounting machine 2. The component supply unit position information J3A4 is information for specifying a disposing position of the component supply unit 24 in the mounting machine 2. The component supply device type specifying information J3A5 is information for specifying a type of the component supply device which is to be refilled with components. The component supply device identification information J3A6 is information for identifying the component supply device. The component identification information J3A7 is information for identifying components. The component type specifying information J3A8 is information for specifying components.

An example illustrated in FIG. 22 shows that at the refill timing TH, the ALF 241 with component supply device ID "IFA1" can be refilled with a reel around which a component housing tape that houses components with component ID "IA1" and component name "A1" is wound. The example in FIG. 22 shows that at the refill timing TH, the tray feeders 1000 and 2000 with component supply device ID "IFT1" can be refilled with a palette on which a tray holding components with component ID "IT1" and component name "T1" is placed, or a magazine housing that palette. The example in FIG. 22 shows that at the refill timing TH, the stick feeders 3000 and 4000 with component supply device ID "IFS1" can be refilled with a stick which houses components with component ID "IS1" and component name "S1" or a magazine which houses that stick. The example of FIG. 22 further shows that at the refill timing TH, a reel around which a component housing tape that houses components with component ID "IZ1" and component name "Z1" is wound is carried from a component storage to the component storage unit 20 installed near the mounting machine 2 and is recommended to be prepared so that a splicing operation can be performed on the splicing feeder 241S with component supply device ID "IFZ1".

The refill specified result information JH3A generated by the refill specifying unit 344 is transmitted to an information output unit 312 of a data communication unit 31, controlled by a communication control unit 341, and transmitted from the information output unit 312 to a mounting machine operation management device 4. A production line operator takes component housing members out of the component storage unit 20 installed near the mounting machine 2, and can perform the refilling operation for the component housing members on the ALFs 241, the tray feeders 1000 and 2000, and the stick feeders 3000 and 4000, based on the refill specified result information JH3A, which is transmitted from the information output unit 312 and is input into the mounting machine operation management device 4. Even if the splicing operation using a component housing tape wound around a new reel cannot be performed on the splicing feeder 241S at the refill timing TH, the new reel can be prepared near the splicing feeder 241S.

A pickup specifying unit 345 of the component refill management system 3 specifies a pickup timing TS representing a time at which the component storage unit 20 installed near the mounting machine 2 needs to pick up a new component housing member for refilling at the refill timing TH, and generates pickup specified result information JH4A illustrated in FIG. 23. The pickup specified result information JH4A includes pickup timing information J4A1 and refill timing information J4A2. The pickup timing information J4A1 is information representing a specified result of the pickup timing TS. The refill timing information J4A2 is information representing a specified result of the refill timing TH. The pickup specified result information JH4A further includes information in which component stock information J4A3, component identification information J4A4, component type specifying information J4A5, and pickup number information J4A6 are associated with one another, as information relating to a new component housing member to be picked up by the component storage unit 20 at the pickup timing TS specified by the pickup specifying unit 345. The component stock information J4A3 is information for specifying a position where the new component housing member to be picked up by the component storage unit 20 is housed in a component storage. The component identification information J4A4 is information for identifying components. The component type specifying information J4A5 is information for specifying components. The pickup number information J4A6 is information representing a number of new component housing members to be picked up by the component storage unit 20.

An example illustrated in FIG. 23 shows that the component storage unit 20 needs to pick up "one" reel, which is stored on a component storage rack with symbol "BA" and around which a component housing tape housing components with ID "IA1" and component name "A1" is wound, at the pickup timing TS. The example of FIG. 23 shows that the component storage unit 20 needs to pick up a palette, which is stored on a component storage rack with rack symbol "BC" and on which a tray holding components with ID "IT1" and component name "T1" is placed, or "one" magazine housing that palette at the pickup timing TS. The example of FIG. 23 shows that the component storage unit 20 needs to pick up a stick, which is housed on a component storage rack with symbol "BD" and houses components with ID "IS1" and component name "S1" or "one" magazine housing that stick at the pickup timing TS. The example of FIG. 23 further shows that the component storage unit 20 needs to pick up "one" reel, which is stored on a component storage rack with symbol "BB" and around which a component housing tape which houses components with ID "IZ1" and component name "Z1" is wound, at the pickup timing TS.

The pickup specified result information JH4A generated by the pickup specifying unit 345 is transmitted to the information output unit 312 of the data communication unit 31, controlled by the communication control unit 341, and transmitted from the information output unit 312 to a component unloading management device 7. A component storage operator unloads a component housing member or the like from the component storage and houses the component housing member in the component storage unit 20 installed near the mounting machine 2, based on the pickup specified result information JH4A which is transmitted from the information output unit 312 and is input into the component unloading management device 7, so that the component housing member or the like is picked up in the component storage unit 20.

Note that the above-described specific embodiments mainly include the disclosure having the following configurations.

One aspect of the present disclosure provides a component refill management system that is installed in a mounting machine and manages refilling of a plurality of component housing members housing components for a plurality of component supply devices, the mounting machine mounting a component to board and producing a mounting board, the plurality of component housing members being attachable to each of the component supply devices. The component refill management system includes a refill specifying unit that specifies a component supply device which is to be refilled with a component housing member, and an information output unit that outputs specified result information representing a specified result obtained by the refill specifying unit. The refill specifying unit includes a first specifying unit that specifies refillable time intervals representing time intervals during which a new component housing member is refillable between a first time at which, in the plurality of component housing members, one component housing member, from which components are precedently supplied, has no component in each of the component supply devices and a second time at which a sum of residual components housed in the plurality of component housing members reaches a predetermined value with the refillable time intervals being associated with the component supply devices, respectively, a second specifying unit that recognizes a first refillable time interval having an earliest second time in the refillable time intervals and specifies a component supply device, which is associated with the first refillable time interval, as a first component supply device which is to be preferentially refilled with a component housing member, and a third specifying unit that specifies a component supply device, which is refillable with a component housing member within the first refillable time interval, as a second component supply device, with reference to the refillable time intervals.

In the above component refill management system, the refill specifying unit further includes a fourth specifying unit that specifies an identical refill timing for component housing members within the first refillable time interval for the first and second component supply devices.

The component refill management system may further include an information acquisition unit that acquires component necessary number information relating to a number of components necessary for producing one mounting board, cycle time information relating to a mounting time for components in the production of one mounting board, and residual component number information relating to the sum of residual components. The refill specifying unit specifies a component supply device which is to be refilled with a component housing member, based on the component necessary number information, the cycle time information, and the residual component number information, and specifies a refill timing for that component supply device.

In the component refill management system, the refill specifying unit specifies a component supply device which is to be refilled with a new component housing member and specifies the refill timing for that component supply device, and the information output unit outputs specified result information representing a specified result obtained by the refill specifying unit. Herein, the refill specifying unit includes the first specifying unit, the second specifying unit, the third specifying unit, and the fourth specifying unit. The first specifying unit specifies refillable time intervals for new component housing members with the refillable time intervals being associated with the component supply devices, respectively. The second specifying unit recognizes the first refillable time interval having the earliest second time, at which the sum of residual components reaches the predetermined value, in the refillable time intervals, and specifies a component supply device, which is associated with the first refillable time interval, as the first component supply device. The third specifying unit specifies a component supply device, which can be refilled with a component housing member in the first refillable time interval, as the second component supply device. The fourth specifying unit specifies an identical refill timing for component housing members within the first refillable time interval for the first and second component supply devices.

The component refill management system does not individually specify refill timings of component housing members for the component supply devices, but enables "collective refilling" such that an operator collectively refill the component housing members for the component supply devices which can be refilled with the component housing members at the identical refill timing. This can reduce a frequency with which the operator moves to the mounting machine mounted with the component supply devices, and thus can reduce a burden of the refilling operation on the operator.

The component refill management system may be configured so that the third specifying unit recognizes, among the refillable time intervals, all second refillable time intervals, which are selected from the residual refillable time intervals other than the first refillable time interval and are included in the time interval having the second time of the first refillable time interval, and specifies all component supply devices, which are associated with the second refillable time intervals, as the second component supply device. The component refill management system may be configured so that the fourth specifying unit recognizes an overlapped time interval in the first and second refillable time intervals, and specifies a predetermined time within the overlapped time interval as the identical refill timing for the first and second component supply devices.

In this mode, the third specifying unit can recognize all second refillable time intervals, which have the second time of the first refillable time interval, in residual refillable time intervals other than the first refillable time interval, and can specify all component supply devices, which are associated with the second refillable time intervals, respectively, as second component supply devices. The fourth specifying unit can recognize an overlapped time interval in the first and second refillable time intervals, and can specify a predetermined time within the overlapped time interval as an identical refill timing for the first and second component supply devices.

In the component refill management system, the fourth specifying unit may specify an earliest time in the overlapped time interval as the refill timing.

The overlapped time interval is a time interval during which "collective refilling" is enabled in which the operator collectively performs the refilling operation for component housing members. The identical refill timing for the first component supply device and the second component supply device is set to the earliest time within the overlapped time interval, and thus the "collective refilling" is enabled with time to spare being allowed until the second time at which the sum of residual components reaches a predetermined value in the first component supply device.

In the component refill management system, the refill specifying unit may further include a fifth specifying unit that specifies a residual component number warning time interval representing a time interval during which a number of residual components is to be warned between the second time and a third time at which the sum of residual components is 0 in each of the component supply devices with the residual component number warning time interval being associated with each of the component supply devices.

In this mode, when the "collective refilling" is not performed at the identical refill timing set for the first and second component supply devices, an operator can perform component housing member refilling operation based on the residual component number warning time interval specified by the fifth specifying unit.

The component refill management system may further include a refilling efficiency improvement specifying unit that specifies an efficiency improvement condition for improving refilling efficiency of component housing members. The refilling efficiency improvement specifying unit includes a target component specifying unit that recognizes components, which are mounted most frequently per unit time, as target components, and specifies the efficiency improvement condition so that a number of the target components housed in the component housing member is increased to a predetermine value for a longer component housing member refilling cycle.

In this mode, the target component specifying unit of the refilling efficiency improvement specifying unit recognizes components, which are mounted most frequently per unit time, as target components. The target component specifying unit then specifies the efficiency improvement condition for improving the refilling efficiency of the component housing member so that the number of the target components housed in the component housing member is increased. This can lengthen the refilling cycle of the component housing member which houses the target components. Therefore, the frequency with which an operator moves to the mounting machine mounted with the component supply devices can be further reduced, and thus the burden on the operator who performs the refilling operation can be reduced.

Another aspect of the present disclosure provides a component mounting system including: a mounting machine that is mounted with a plurality of component supply devices to which a plurality of component housing members housing components are attachable, and mounts components to boards and produces mounting boards; the component refill management system that manages refilling of the component housing members for the plurality of component supply devices, and a management device that is data-communicably connected to the component refill management system via the information output unit and manages the production of the mounting board.

In the component mounting system which includes the component refill management system that can reduce the burden on the operator who performs the refilling operation, a delay in the refilling operation performed by the operator is reduced, and thus suspension of supply of the components from the component supply device can be reduced as far as possible during the production of the mounting board. This configuration can prevent a decrease in production efficiency of a mounting board.

As described above, the present disclosure can provide the component refill management system that can reduce the burden on the operator who performs the refilling operation on the component housing members for the component supply devices, and the component mounting system including the component refill management system.

What is claimed is:

1. A component refill management system that is installed in a mounting machine and manages refilling of a plurality of component housing members which house components for a plurality of component supply devices, the mounting machine mounting a component to board and producing a mounting board, the plurality of component housing members being attachable to each of the component supply devices, the system comprising:
a controller including a processor configured to:
specify a component supply device which is to be refilled with a component housing member;
specify refillable time intervals representing time intervals during which a new component housing member is refillable with the refillable time intervals being associated with the component supply devices, respectively,
recognize a first refillable time interval indicating when a first component supply device is available for refilling, and at which the refillable time interval ends earliest in the refillable time intervals and specify a component supply device, which is available for refilling during the first refillable time interval, as the first component supply device which is to be preferentially refilled with a component housing member, and
specify a different component supply device, which is refillable with a component housing member within the first refillable time interval, as a second component supply device, with reference to the refillable time intervals; and
an interface circuit configured to output specified result information representing a specified result obtained from the processor.

2. The component refill management system according to claim 1, wherein
the processor is configured to specify, as the refillable time intervals being associated with the component supply devices respectively, the time intervals between a first time at which, in the plurality of component housing members, one component housing member, from which components are precedently supplied, has no component in each of the component supply devices and a second time which is a time before residual components housed in the plurality of component housing members have no component and which is defined as a time to be warned, the processor is configured to recognize, as the first refillable time interval, a refillable time interval having an earliest second time in the refillable time intervals.

3. The component refill management system according to claim 2, wherein the processor is configured to specify, as the second time, a time at which a sum of residual components housed in the plurality of component housing members reaches a predetermined value.

4. The component refill management system according to claim 1, wherein the processor is configured to specify an identical refill timing for the component housing members within the first refillable time interval for the first and second component supply devices.

5. The component refill management system according to claim 2, wherein the processor is configured to specify an identical refill timing for the component housing members within the first refillable time interval for the first and second component supply devices.

6. The component refill management system according to claim 3, wherein the processor is configured to specify an identical refill timing for the component housing members within the first refillable time interval for the first and second component supply devices.

7. The component refill management system according to claim 4, wherein the interface circuit is further configured to acquire component necessary number information relating to a number of components necessary for producing one mounting board, cycle time information relating to a mounting time for components during the production of one mounting board, and residual component number information relating to the sum of residual components, wherein the processor is configured to specify a component supply device which is to be refilled with the component housing member, based on the component necessary number information, the cycle time information, and the residual component number information, and specify a refill timing for the specified component supply device.

8. The component refill management system according to claim 5, wherein the interface circuit is further configured to acquire component necessary number information relating to a number of components necessary for producing one mounting board, cycle time information relating to a mounting time for components during the production of one mounting board, and residual component number information relating to the sum of residual components, wherein the processor is configured to specify a component supply device which is to be refilled with the component housing member, based on the component necessary number information, the cycle time information, and the residual component number information, and specify a refill timing for the specified component supply device.

9. The component refill management system according to claim 6, wherein the interface circuit is further configured to acquire component necessary number information relating to a number of components necessary for producing one mounting board, cycle time information relating to a mounting time for components during the production of one mounting board, and residual component number information relating to the sum of residual components, wherein the processor is configured to specify a component supply device which is to be refilled with the component housing member, based on the component necessary number information, the cycle time information, and the residual component number information, and specify a refill timing for the specified component supply device.

10. The component refill management system according to claim 5, wherein the processor is configured to recognize, among the refillable time intervals, all second refillable time intervals, which are selected from the residual refillable time intervals other than the first refillable time interval and are included in the time interval having the second time of the first refillable time interval, and specify all component supply devices, which are associated with the second refillable time intervals, as the second component supply device, and the processor is configured to recognize an overlapped time interval in the first and second refillable time intervals, and specify a predetermined time within the overlapped time interval as the identical refill timing for the first and second component supply devices.

11. The component refill management system according to claim 6, wherein the processor is configured to specify, among the refillable time intervals, all second refillable time intervals, which are selected from the residual refillable time intervals other than the first refillable time interval and are included in the time interval having the second time of the first refillable time interval, and specify all component supply devices, which are associated with the second refillable time intervals, as the second component supply device, and the processor is configured to recognize an overlapped time interval in the first and second refillable time intervals, and specify a predetermined time within the overlapped time interval as the identical refill timing for the first and second component supply devices.

12. The component refill management system according to claim 10, wherein the processor is configured to specify an earliest time within the overlapped time interval as the refill timing.

13. The component refill management system according to claim 11, wherein the processor is configured to specify an earliest time within the overlapped time interval as the refill timing.

14. The component refill management system according to claim 5, wherein the processor is configured to specify a residual component number warning time interval representing a time interval during which a number of residual components is to be warned between the second time and a third time at which the sum of residual components is 0 in each of the component supply devices with the residual component number warning time interval being associated with each of the component supply devices.

15. The component refill management system according to claim 6, wherein the processor is configured to specify a residual component number warning time interval representing a time interval during which a number of residual components is to be warned between the second time and a third time at which the sum of residual components is 0 in each of the component supply devices with the residual component number warning time interval being associated with each of the component supply devices.

16. The component refill management system according to claim 4, wherein the processor is configured to specify an efficiency improvement condition for improving refilling efficiency of the component housing members, wherein the the processor is configured to recognize components, which are mounted most frequently per unit time, as target components, and specify the efficiency improvement condition so that a number of the target components housed in the component housing member is increased to a predetermine value for a longer component housing member refilling cycle.

17. The component refill management system according to claim 5, wherein the processor is configured to specify an efficiency improvement condition for improving refilling efficiency of the component housing members, wherein the processor is configured to recognize components, which are mounted most frequently per unit time, as target components, and specify the efficiency improvement condition so that a number of the target components housed in the component housing member is increased to a predetermined value for a longer component housing member refilling cycle.

18. The component refill management system according to claim 6, wherein the processor is configured to specify an efficiency improvement condition for improving refilling efficiency of the component housing members, wherein the processor is configured to recognize components, which are mounted most frequently per unit time, as target components, and specify the efficiency improvement condition so that a number of the target components housed in the component housing member is increased to a predetermine value for a longer component housing member refilling cycle.

19. A component mounting system comprising:

the mounting machine that is mounted with a plurality of component supply devices to which a plurality of component housing members housing components are attachable, and is configured to mount components to boards and produces mounting boards;

the component refill management system according to claim 1 that is configured to manage refilling of the component housing members for the plurality of component supply devices; and a management device including a processor that is data-communicably connected to the component refill management system via the interface circuit and is configured to manage the production of the mounting board.

20. A component mounting system comprising:

the mounting machine that is mounted with a plurality of component supply devices to which a plurality of component housing members housing components are attachable, and is configured to mount components to boards and produces mounting boards;

the component refill management system according to claim 2 that is configured to manage refilling of the component housing members for the plurality of component supply devices; and a management device including a processor that is data-communicably connected to the component refill management system via the interface circuit and is configured to manage the production of the mounting board by controlling operations of the mounting machine.

* * * * *